United States Patent
Furukawa et al.

(10) Patent No.: US 11,185,001 B2
(45) Date of Patent: Nov. 23, 2021

(54) COMPONENT PLACING DEVICE

(71) Applicant: Panasonic Intellectual Property Management Co., Ltd., Osaka (JP)

(72) Inventors: Daisuke Furukawa, Fukuoka (JP); Koichi Obayashi, Fukuoka (JP); Seiichi Matsuo, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/141,694

(22) Filed: Jan. 5, 2021

(65) Prior Publication Data
US 2021/0127535 A1 Apr. 29, 2021

Related U.S. Application Data

(62) Division of application No. 16/121,188, filed on Sep. 4, 2018, now Pat. No. 10,918,001.

(30) Foreign Application Priority Data

Sep. 25, 2017 (JP) .............................. JP2017-183141

(51) Int. Cl.
*B23P 19/00* (2006.01)
*H05K 13/08* (2006.01)
*H05K 13/04* (2006.01)

(52) U.S. Cl.
CPC ....... *H05K 13/0882* (2018.08); *H05K 13/041* (2018.08); *H05K 13/0409* (2018.08);
(Continued)

(58) Field of Classification Search
CPC ........... H05K 13/0408; H05K 13/0409; H05K 13/0813; H05K 13/082; H05K 13/084;
(Continued)

(56) References Cited

U.S. PATENT DOCUMENTS

| 5,923,132 A * | 7/1999 | Boyer .............. G05B 19/40931 318/34 |
| 7,003,872 B2 * | 2/2006 | Mimura ............. H05K 13/0413 29/832 |

(Continued)

FOREIGN PATENT DOCUMENTS

| CN | 105592683 A | 5/2016 |
| JP | 2008-227140 A | 9/2008 |

OTHER PUBLICATIONS

Chinese Search Report dated Nov. 5, 2020 for the related Chinese Patent Application No. 201811112085.7.

*Primary Examiner* — Thiem D Phan
(74) *Attorney, Agent, or Firm* — Pearne & Gordon LLP

(57) ABSTRACT

A component placing device to place a component on a board, including: a shaft having a lower portion and an upper portion; a component holder that is attached to the lower portion of the shaft in a state of being vertically displaceable and has a suction hole for holding the component by a negative pressure; an elastic body that biases the component holder downward with respect to the shaft; a servo motor that raises and lowers the shaft; and a controller that sets a thrust limit value for limiting a thrust of the servo motor and limits the thrust of the servo motor to be equal to or lower than the thrust limit value when the component holder is lowered toward the board. The thrust limit value is set within a range in which a load is smaller than a force by which the elastic body biases the component holder.

9 Claims, 19 Drawing Sheets

(52) U.S. Cl.
CPC ....... *H05K 13/0413* (2013.01); *H05K 13/082* (2018.08); *H05K 13/084* (2018.08); *Y10T 29/4913* (2015.01); *Y10T 29/5313* (2015.01)

(58) Field of Classification Search
CPC ............ H05K 13/0882; Y10T 279/247; Y10T 408/554; Y10T 483/10; Y10T 29/4913; Y10T 29/5313
USPC ...... 29/729, 832, 564.1, 709, 721, 739, 740, 29/743, 829, 833, 834, 840
See application file for complete search history.

(56) References Cited

U.S. PATENT DOCUMENTS

| | | |
|---|---|---|
| 7,062,334 B2 | 6/2006 | Tanaka et al. |
| 8,667,670 B2 | 3/2014 | Ishida |

\* cited by examiner

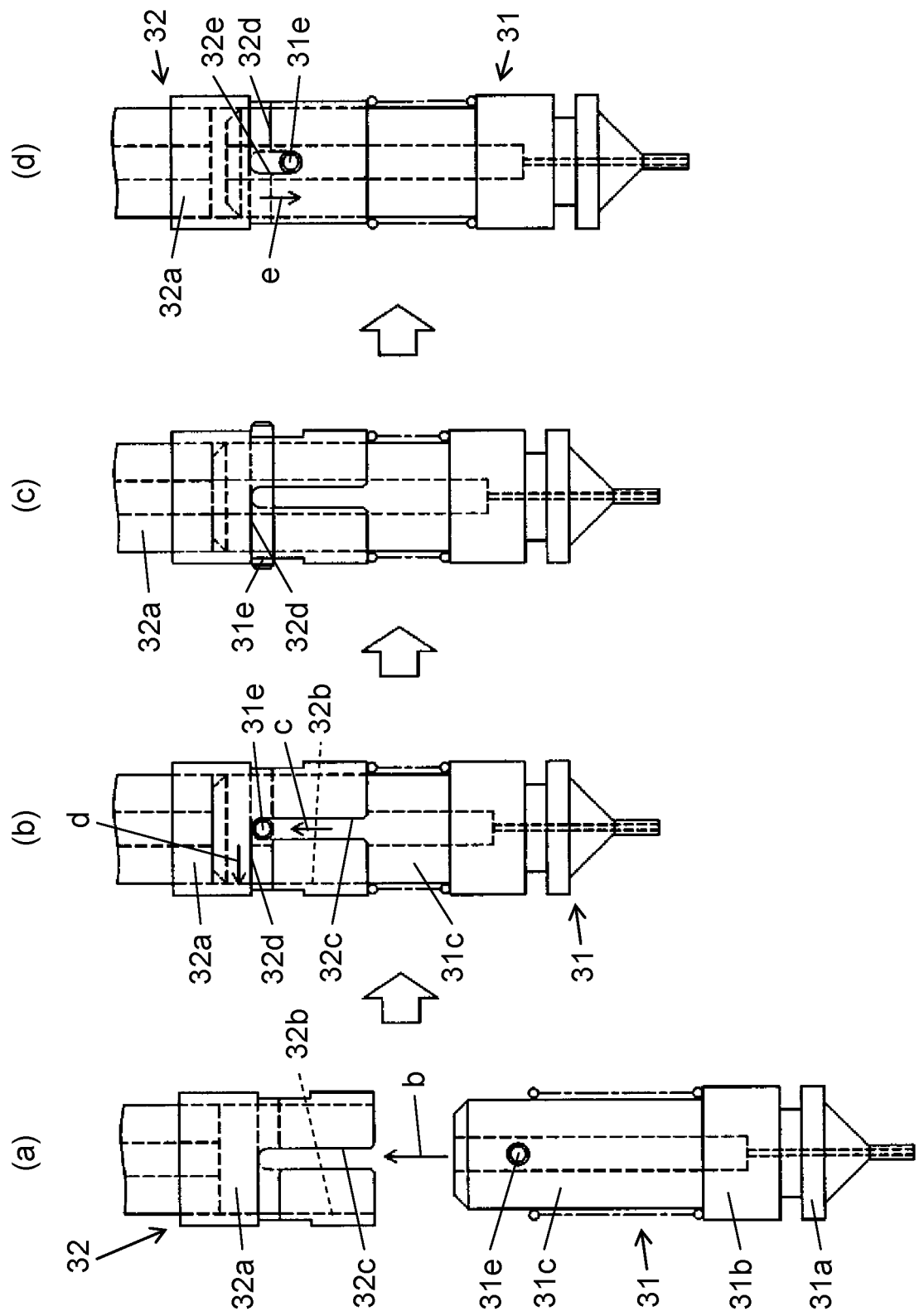

$LF = T + W - F1 - F2$ ... (1)
$FP > LF$ ... (2)

| INSTALLATION POSITION No | INSTALLATION POSITION COORDINATES (X, Y, θ) | INSTALLATION POSITION HEIGHT (Z) | COMPONENT NAME | |
|---|---|---|---|---|
| MP1 | X1,Y1,θ1 | Z1 | PN1 | |
| MP2 | X2,Y2,θ2 | Z2 | PN2 | |
| MP3 | X3,Y3,θ3 | Z3 | PN3 | |
| MP4 | X4,Y4,θ4 | Z4 | PN4 | |
| MP5 | X5,Y5,θ5 | Z5 | PN5 | |
| | | | | |

M0-1

M0-2

COMPONENT PLACING DEVICE

CROSS-REFERENCE TO RELATED APPLICATIONS

This application is a division of U.S. patent application Ser. No. 16/121,188 filed Sep. 4, 2018, which claims the benefit of priority from the prior Japanese Patent Application No. 2017-183141, filed on Sep. 25, 2017, the entire contents of which are incorporated herein by reference.

BACKGROUND

1. Technical Field

The present disclosure relates to a component placing device and a component placing method for placing a component at an installation position of a board.

2. Description of the Related Art

In a component placing device used for placing a component on a board in a manufacturing process of a component placing board, it is necessary to absorb fluctuation of an installation height position due to curvature deformation or the like of the board during a placing operation, and to control an installation load that presses the component at an installation position of the board to an appropriate value that corresponds to a target component. In order to realize the function, in the related art, a configuration has been known in which a load buffering spring is incorporated in a placing nozzle that holds a component and places the component on a board (refer to, for example, Japanese Patent Unexamined Publication No. 2008-227140). In the technology in the related art disclosed in Japanese Patent Unexamined Publication No. 2008-227140, an example in which, in the configuration in which a suction nozzle is biased by an elastic body, such as a coil spring, based on an approximate curve expression obtained by measuring a correlation between a pushing amount of the suction nozzle and a pressing load by a load sensor, load control during the placing operation is performed, is described.

SUMMARY

According to an aspect of the disclosure, there is provided a component placing device which places a component on a board, including: a shaft having a lower portion and an upper portion; a component holder that is attached to the lower portion of the shaft in a state of being vertically displaceable and has a suction hole for holding the component by a negative pressure; an elastic body that biases the component holder downward with respect to the shaft; a servo motor that raises and lowers the shaft; and a controller that causes the component holder to perform a raising and lowering operation for placing the component held by the component holder on the board by controlling the servo motor based on a preset operation pattern, in which the controller includes a thrust limiter that sets a thrust limit value for limiting a thrust of the servo motor and limits the thrust of the servo motor to be equal to or lower than the thrust limit value when the component holder is lowered toward the board, and in which the thrust limit value is set within a range in which a load that acts on the component from the component holder when the servo motor is driven with a thrust equal to the thrust limit value is smaller than a force by which the elastic body biases the component holder.

According to another aspect of the disclosure, there is provided a component placing method for manufacturing a component placing board in which a component is placed on a board by a component placing device including a shaft having a lower portion and an upper portion, a component holder that is attached to the lower portion of the shaft in a state of being vertically displaceable and has a suction hole for holding the component by a negative pressure, an elastic body that biases the component holder downward with respect to the shaft, a servo motor that raises and lowers the shaft, and a controller that causes the component holder to perform a raising and lowering operation for placing the component held by the component holder at an installation position of the board by controlling the servo motor based on a preset operation pattern, in which the controller moves the component holder that holds the component above the installation position of the board, sets a thrust limit value for limiting a thrust of the servo motor within a range in which a load that acts on the component from the component holder when the servo motor is driven by a thrust equal to the thrust limit value is smaller than a force by which the elastic body biases the component holder, lowers the component holder toward the installation position by controlling the servo motor based on the operation pattern, limits the thrust of the servo motor to be equal to or lower than the thrust limit value before the component lands at the installation position, and separates the component holder from the component that has landed at the installation position by raising the component holder after the component has landed at the installation position.

According to the disclosure, it is possible to stably control an installation load with high accuracy in a low-load region.

BRIEF DESCRIPTION OF THE DRAWINGS

FIG. 7 is an operation explanatory view of an installation operation to a holder of the component holder in the placing head included in the component placing device according to the embodiment of the disclosure;

DETAILED DESCRIPTION

The above-described technology of the related art has the following problems. In other words, with miniaturization of electronic devices in recent years, components to be mounted are becoming smaller and thinner, and depending on the component type, an appropriate installation load at the time of component placement is substantially reduced compared to the related art. Since the component loading capacity is small in such a component type, it is necessary to control an installation load in a low-load region because there is a concern that component cracks and other damages are caused unless the installation load setting is not appropriate. However, in a configuration in which a suction nozzle is biased by an elastic body including the above-described related art, due to a variation in the sliding state of a mechanism that holds the suction nozzle, it is difficult to stably control the installation load with respect to micro component with high accuracy in the low-load region.

Here, an object of the disclosure is to provide a component placing device and a component placing method capable of stably controlling an installation load with high accuracy in a low-load region.

Figure 1:
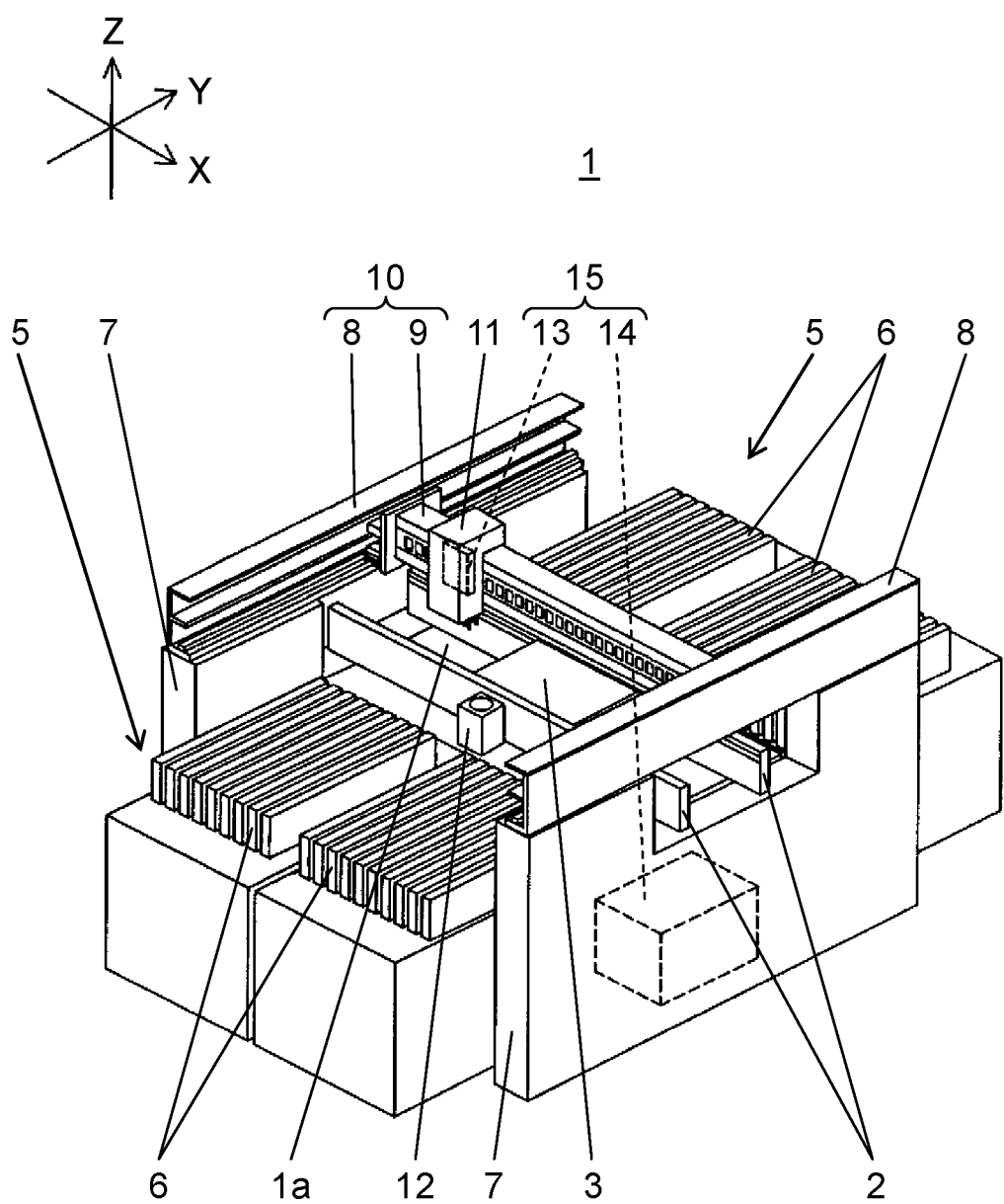
FIG. 1 is a perspective view illustrating the overall configuration of a component placing device according to an embodiment of the disclosure.

Next, embodiments of the disclosure will be described with reference to the drawings. First, with reference to FIG. 1, the configuration and function of component placing device 1 will be described. Component placing device 1 has a function of manufacturing a component placing board by placing a component on a board. In FIG. 1, board transporter 2 is disposed on an upper surface of base 1a in an X direction (board transport direction). Board transporter 2 receives board 3 which is a target of component installation work from an upstream side device (not illustrated), transports and positions and holds board 3 at an installation working position in component placing device 1. In other words, board transporter 2 functions as a board holder that holds board 3. Component supplier 5 is disposed on both sides of board transporter 2, and a plurality of tape feeders 6 are juxtaposed in component supplier 5. Tape feeder 6 has a function of transporting a carrier tape that stores component P (refer to FIGS. 12A and 13) to a component pick-up position by placing head 11 described below.

On the upper surfaces of a pair of frame members 7 arranged in both end portions in the X direction in component placing device 1, Y-axis moving table 8 driven by a linear motor is arranged in a Y direction. Similarly, X-axis moving table 9 driven by a linear motor is installed between Y-axis moving tables 8 so as to be movable in the Y direction. In X-axis moving table 9, placing head 11 is installed so as to be freely movable in the X direction.

Y-axis moving table 8 and X-axis moving table 9 configure XY table 10, and by driving XY table 10, placing head 11 moves in the XY directions. Accordingly, placing head 11 picks up component P from tape feeder 6 by component holder 31 (refer to FIG. 2A) and installs component P on board 3. Therefore, XY table 10 is a placing head moving mechanism for moving placing head 11 with respect to board holder that holds board 3 and component supplier 5 that supplies component P.

In a movement path of placing head 11 between board transporter 2 and component supplier 5, component recognition camera 12 is disposed with an imaging direction directed upward. Component recognition camera 12 images component P which is in a state of being held by placing head 11 from below. By performing recognizing processing with respect to the imaging result, identification or position detection of component P held by placing head 11 are performed. Placing head 11 has placing head controller 13 built therein, and main body controller 14 is built in base 1a.

The placing head controller 13 has a function of controlling a raising and lowering operation of component holder 31 (refer to FIG. 2A) that holds component P in placing head 11. In addition, main body controller 14 has a function of controlling a device main body and issuing work instructions to placing head controller 13. Placing head controller 13 and main body controller 14 configure controller 15 for controlling each portion of component placing device 1. Controller 15 includes, for example, at least one processor and at least one memory that stores a program. By executing the program by a processor, control of each portion is executed.

Figure 2A:
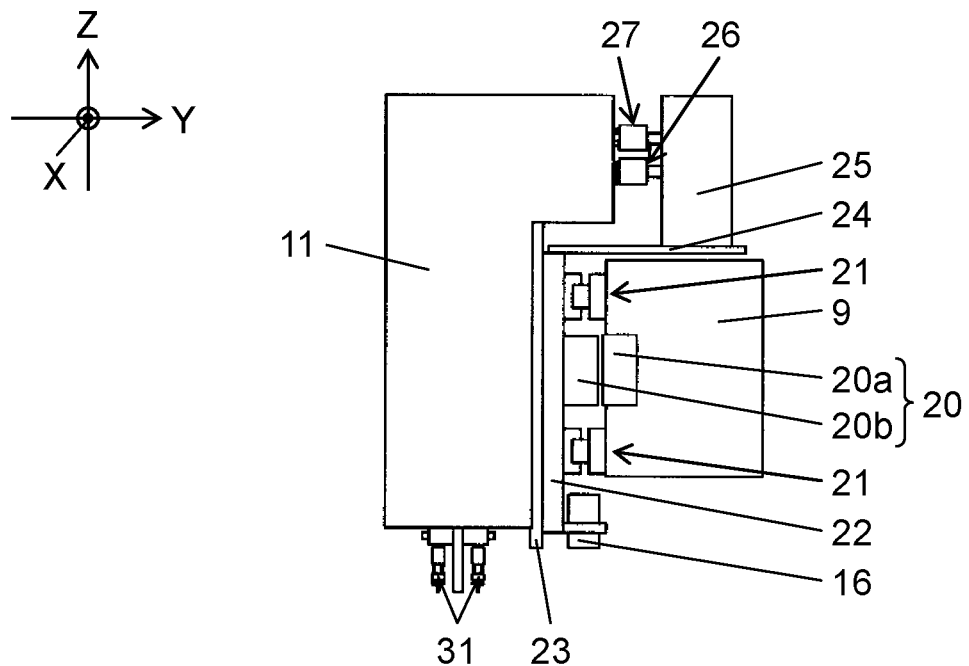
FIG. 2A is a configuration explanatory view of a placing head included in the component placing device according to the embodiment of the disclosure.
Figure 2B:
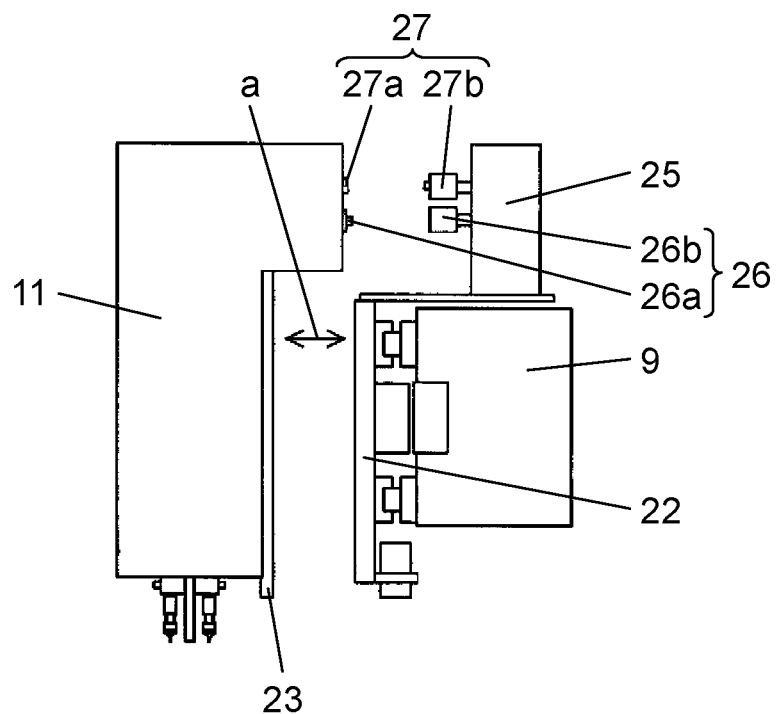
FIG. 2B is a configuration explanatory view of the placing head included in the component placing device according to the embodiment of the disclosure.

In the embodiment, placing head 11 is attachable to and detachable from X-axis moving table 9 of XY table 10 which is a placing head moving mechanism. FIG. 2A illustrates a section of X-axis moving table 9 in a state where placing head 11 is installed on X-axis moving table 9. Back surface member 23 is provided on a back surface of placing head 11 having a configuration in which component holder 31 that holds the component is provided in a lower end portion. As illustrated in FIG. 2B, back surface member 23 is attachable to and detachable from (arrow a) moving base 22 provided on X-axis moving table 9.

Moving base 22 is freely coupled to X-axis moving table 9 in the X direction via a pair of slide guides 21. Moving base 22 is driven in the X direction with respect to the X-axis moving table 9 by linear motor 20. Linear motor 20 has a configuration in which moving element 20b coupled to moving base 22 is opposed to stator 20a arranged in the X direction on X-axis moving table 9. In the lower end portion of moving base 22, board recognition camera 16 is disposed with the imaging direction oriented downward. Board recognition camera 16 moves integrally with placing head 11 and images board 3 positioned below.

Connector holder 25 is coupled to upper end portion of moving base 22 via horizontal coupling member 24. An upper portion of placing head 11 and connector holder 25 are connected to each other via piping connector 26 and wiring connector 27. Piping connector 26 has a function of supplying pneumatic pressure or vacuum pressure from the device main body to placing head 11. Wiring connector 27 has a function of supplying power and exchanging electric signals to and from placing head 11 from the device main body. Accordingly, placing head controller 13 built in placing head 11 and main body controller 14 built in base 1a are connected to each other.

As illustrated in FIG. 2B, in a state where back surface member 23 is detached from moving base 22, head side connectors 26a and 27a provided in placing head 11 in piping connector 26 and wiring connector 27 are separated from main body side connectors 26b and 27b provided in connector holder 25. In addition, when installing placing head 11 on another component placing device, back surface member 23 is fixedly coupled to moving base 22 of the other device, and head side connectors 27a and 26a are fitted to main body side connectors 26b and 27b provided in connector holder 25 of another device.

Figure 3:
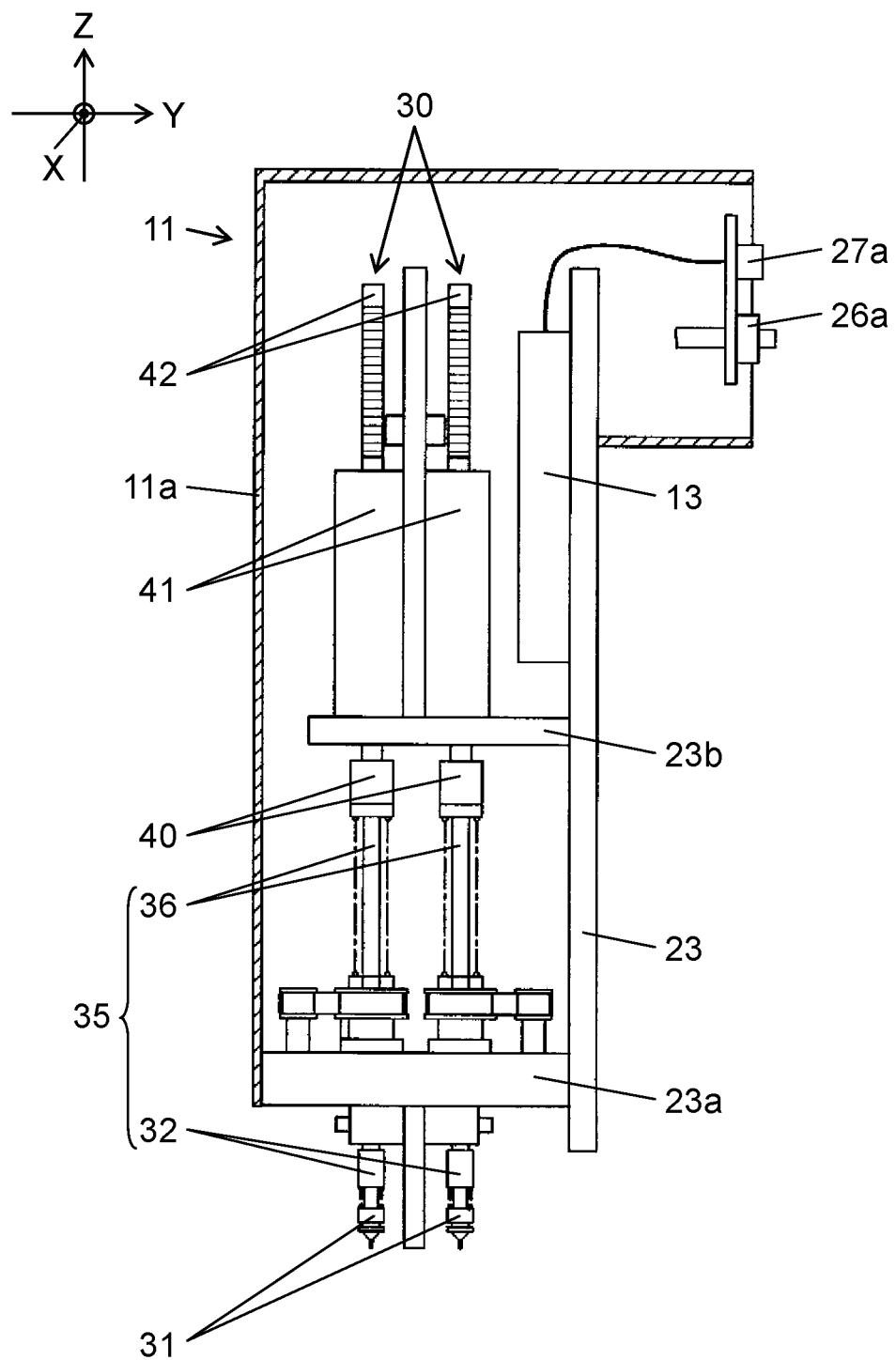
FIG. 3 is a side sectional view of the placing head included in the component placing device according to the embodiment of the disclosure.
Figure 4:
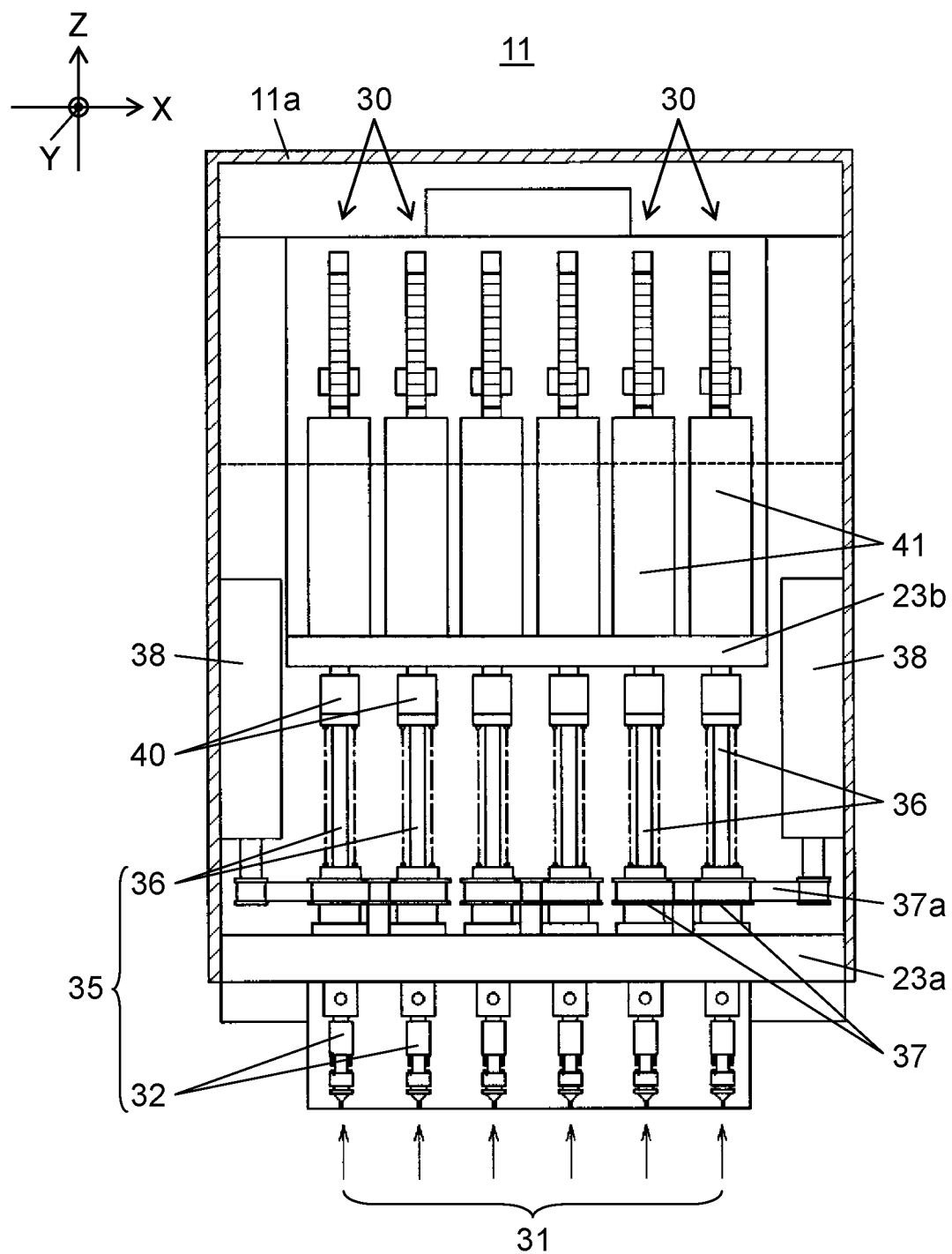
FIG. 4 is a front sectional view of the placing head included in the component placing device according to the embodiment of the disclosure.

Next, with reference to FIGS. 3 and 4, the configuration of placing head 11 will be described. As illustrated in FIGS. 3 and 4, placing head 11 has a configuration in which a plurality (here, 12 nozzles in which six nozzle rows in which six nozzles are arranged in the X direction are disposed in two rows in the Y direction) of nozzle units 30 are disposed on a front surface of vertical back surface member 23. Nozzle units 30 are held by shaft holder 23a and servo motor attacher 23b which are fixed to back surface member 23, and an outer surface side thereof is enclosed by cover member 11a.

As illustrated in FIG. 3, nozzle unit 30 has a configuration in which shaft 35 having upper portion 36 and lower portion 32 is raised and lowered by servo motor 41, and accordingly, component holder 31 is raised and lowered. Shaft 35 is supported by shaft holder 23a, and servo motor 41 is attached to servo motor attacher 23b. Moving rod 42 that moves to be raised and lowered by servo motor 41 is coupled to upper portion 36 via rotating member 40. Rotating member 40 is rotatably installed on moving rod 42, and upper portion 36 is coupled to moving rod 42 in a form that allows relative rotation.

By driving servo motor 41, component holder 31 installed on lower portion 32 of shaft 35 is raised and lowered, and accordingly, a raising and lowering operation for placing component P held by component holder 31 on board 3 is performed. Placing head controller 13 for causing the raising and lowering operation of component holder 31 is attached to back surface member 23 and connected to head side connectors 27a, and with the configuration, as described above, it is possible to connect placing head controller 13 to main body controller 14 to be attachable and detachable.

As illustrated in FIG. 4, pulley 37 is attached to each upper portion 36 in a form that the rotation can be transmitted to the upper portion 36 while allowing the upper portion 36 to be raised and lowered. Belt 37a looped to pulley 37 is driven by θ-axis motor 38, and accordingly, each upper portion 36 can be rotated and a θ rotation operation for rotating component holder 31 around a nozzle axis becomes possible. The plurality of component holders 31 have a function of holding component P by a negative pressure introduced into suction holes 31d (refer to FIG. 6A).

In other words, placing head 11 of component placing device 1 illustrated in the embodiment includes: a plurality of component holders 31 that hold component P by the negative pressure introduced into suction hole 31d; a plurality of servo motors 41 that raises and lowers the plurality of component holders 31; placing head controller 13 that causes component holder 31 to perform the raising and lowering operation for placing component P held by component holder 31 on board 3 by controlling the servo motor based on the preset operation pattern.

Figure 5:
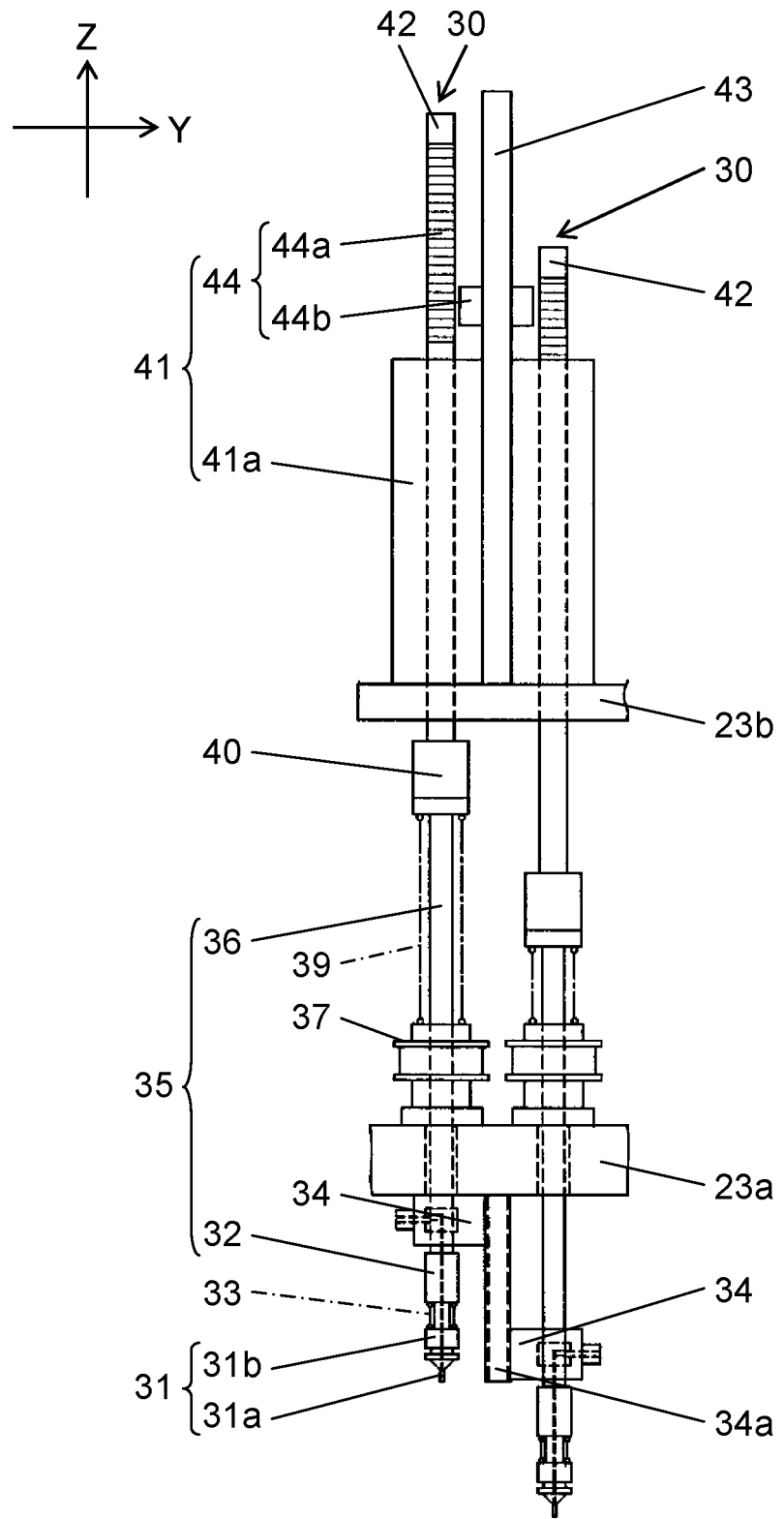
FIG. 5 is a configuration explanatory view of a nozzle unit in the placing head included in the component placing device according to the embodiment of the disclosure.

Next, with reference to FIG. 5, the configuration and function of nozzle unit 30 will be described. In FIG. 5, shaft 35 having upper portion 36 and lower portion 32 is held by shaft holder 23a. Component holder 31 including nozzle 31a and nozzle holder 31b is attached to holder section 32a (refer to FIGS. 6A and 6B) provided in lower portion 32 in a state of being displaceable in the up-down direction. Between lower portion 32 and nozzle holder 31b of component holder 31, biasing member 33 using a compression spring which is as an elastic body is installed. Biasing member 33 constantly presses component holder 31 downward with a predetermined biasing force previously set as a pressurization value.

Return spring 39 which is a compression spring is installed between pulley 37 attached to upper portion 36 and rotating member 40. Return spring 39 allows an upward reaction force to act on rotating member 40. In other words, when lowering component holder 31, upper portion 36 is lowered against the reaction force of return spring 39 by the downward thrust of servo motor 41. In addition, when raising component holder 31, upper portion 36 is raised by the upward reaction force of return spring 39 by the upward thrust of servo motor 41.

On shaft 35, air joint 34 is provided to be positioned above lower portion 32. Air joint 34 allows suction hole 31d provided in component holder 31 to communicate with an external negative pressure generating source (not illustrated). When raising and lowering component holder 31, air joint 34 is guided to raising and lowering guide member 34a provided to extend downward from shaft holder 23a and is raised and lowered together with shaft 35.

Servo motor 41 that raises and lowers shaft 35 includes: linear motor 41a for driving moving rod 42 inserted in the up-down direction to be raised and lowered; and encoder 44 for outputting a pulse signal in accordance with the movement of moving rod 42. Encoder 44 includes: linear scale 44a provided in moving rod 42; and movement detector 44b which is provided in vertical member 43 so as to oppose linear scale 44a and detects the movement of linear scale 44a. Movement detector 44b outputs an encoder pulse indicating the movement distance and direction of linear scale 44a to position detector 53 (refer to FIG. 8) as a position signal.

Figure 6A:
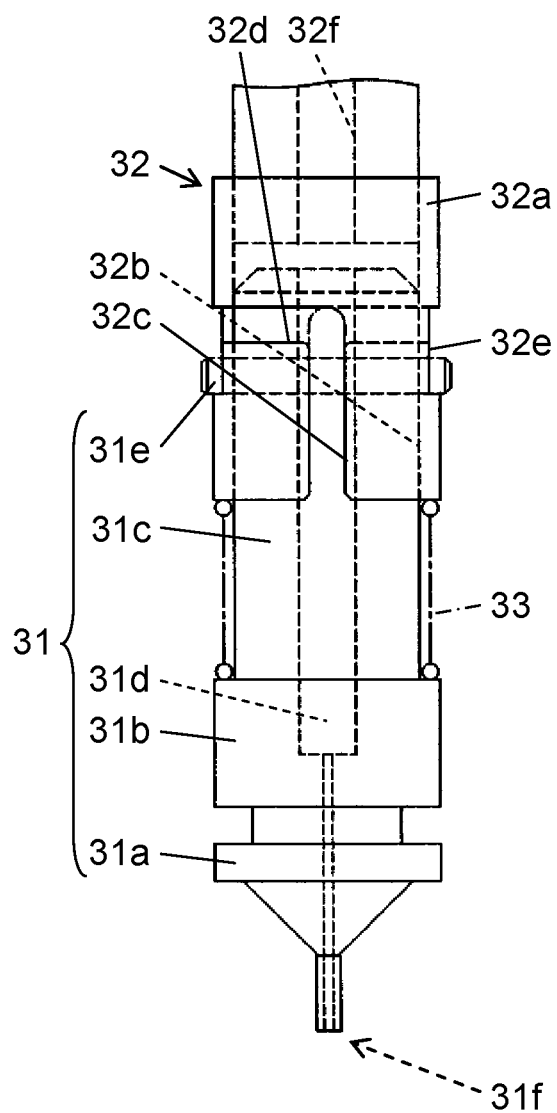
FIG. 6A is a configuration explanatory view of a component holder in the placing head included in the component placing device according to the embodiment of the disclosure.
Figure 6B:
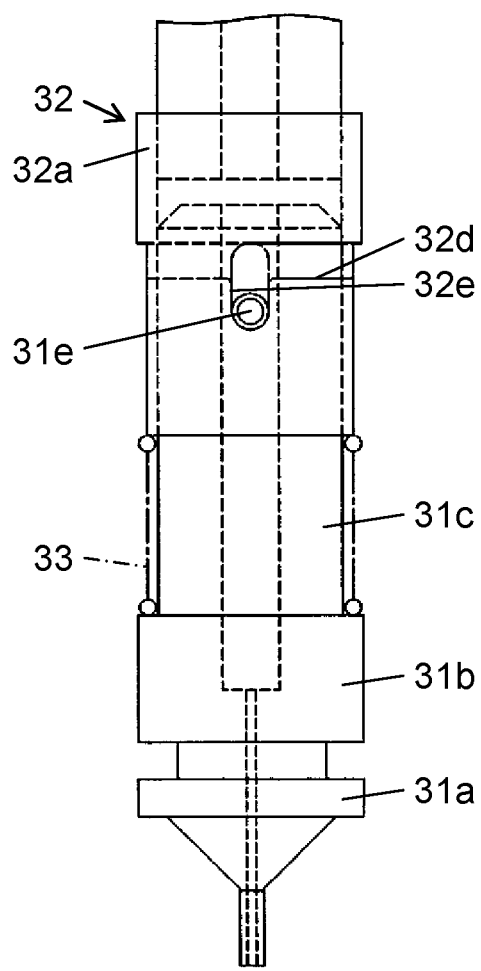
FIG. 6B is a configuration explanatory view of the component holder in the placing head included in the component placing device according to the embodiment of the disclosure.

Next, with reference to FIGS. 6A, 6B, and 7, a detailed configuration of component holder 31 and an installation operation for installing and holding component holder 31 to lower portion 32 will be described. FIGS. 6A and 6B illustrate a side surface in a state where component holder 31 is held by lower portion 32, and FIGS. 6A and 6B illustrate side surfaces in two directions orthogonal to each other, respectively.

As illustrated in FIG. 6A, lower portion 32 is provided with holder section 32a for holding component holder 31. In fitter 32b provided in a hollow circular hole shape in holder section 32a, slider 31c provided in a columnar shape in component holder 31 is fitted in a displaceable state in the up-down direction. Nozzle holder 31b is provided in the lower portion of slider 31c, and nozzle holder 31b holds nozzle 31a provided with suctioner 31f for suctioning the component.

At the upper end of slider 31c, pin 31e for fixing the position of component holder 31 to holder section 32a is provided in a shape that protrudes on both sides in a radial direction. In holder section 32a, a guide groove for guiding pin 31e to a fixed position is provided in a configuration described below. In other words, as illustrated in FIG. 6A, on the side surface of holder section 32a, inserter 32c which reaches a vertically upper part from the lower end surface of holder section 32a is provided.

In the upper end portion of inserter 32c, horizontal portion 32d is provided within a range in which holder section 32a revolves by a half turn. Furthermore, as illustrated in FIG. 6B, a terminal end portion of horizontal portion 32d is connected to guide 32e that extends vertically downward to the middle of the height of holder section 32a. In a state where component holder 31 is held by holder section 32a, pin 31e is positioned in the lower end portion of guide 32e, and accordingly, component holder 31 is held by holder section 32a. At this time, a predetermined clearance is ensured between the upper end portion of slider 31c and a ceiling surface of fitter 32b, and pin 31e can move in the up-down direction in guide 32e. Accordingly, the position of component holder 31 in the up-down direction with respect to lower portion 32 is displaceable.

Suctioner 31f communicates with suction hole 31d formed on the inside of component holder 31, and in a state where component holder 31 is held by holder section 32a, suction hole 31d is in a state of communicating with suction hole 32f formed in lower portion 32. Suction hole 32f is connected to an external negative pressure generating source via air joint 34 (refer to FIG. 5), and accordingly, component P is held by the negative pressure by nozzle 31a in component holder 31.

In the above-described configuration, nozzle 31a, nozzle holder 31b, slider 31c, suction hole 31d, and pin 31e are attached to lower portion 32 of shaft 35 in a state of being displaceable in the up-down direction, and configure component holder 31 having suction hole 31d for holding the component by the negative pressure. Biasing member 33 which is an elastic body is fitted to an outer circumference of slider 31c between the lower end surface of holder section 32a and nozzle holder 31b. Biasing member 33 biases component holder 31 downward against lower portion 32 of shaft 35.

Next, with reference to FIG. 7, an operation procedure for holding component holder 31 by holder section 32a of lower portion 32 will be described. First, as illustrated in FIG. 7(a), in component holder 31, pin 31e provided in slider 31c is positioned with respect to inserter 32c of holder section 32a. In addition, in the state, component holder 31 is brought closer to holder section 32a (arrow b) so as to make slider 31c fitted to fitter 32b.

Next, as illustrated in FIG. 7(b), while guiding pin 31e with inserter 32c (arrow c), component holder 31 is raised, and when pin 31e reaches horizontal portion 32d, component holder 31 is rotated around the axis while guiding pin 31e by horizontal portion 32d. Accordingly, as illustrated in FIG. 7(c), pin 31e reaches the terminal end portion of horizontal portion 32d. After this, as illustrated in FIG. 7(d), while guiding pin 31e with guide 32e (arrow e), component holder 31 is lowered. Accordingly, pin 31e is positioned in the lower end portion of guide 32e, and component holder 31 is in a state of being held by holder section 32a of lower portion 32.

Figure 10:
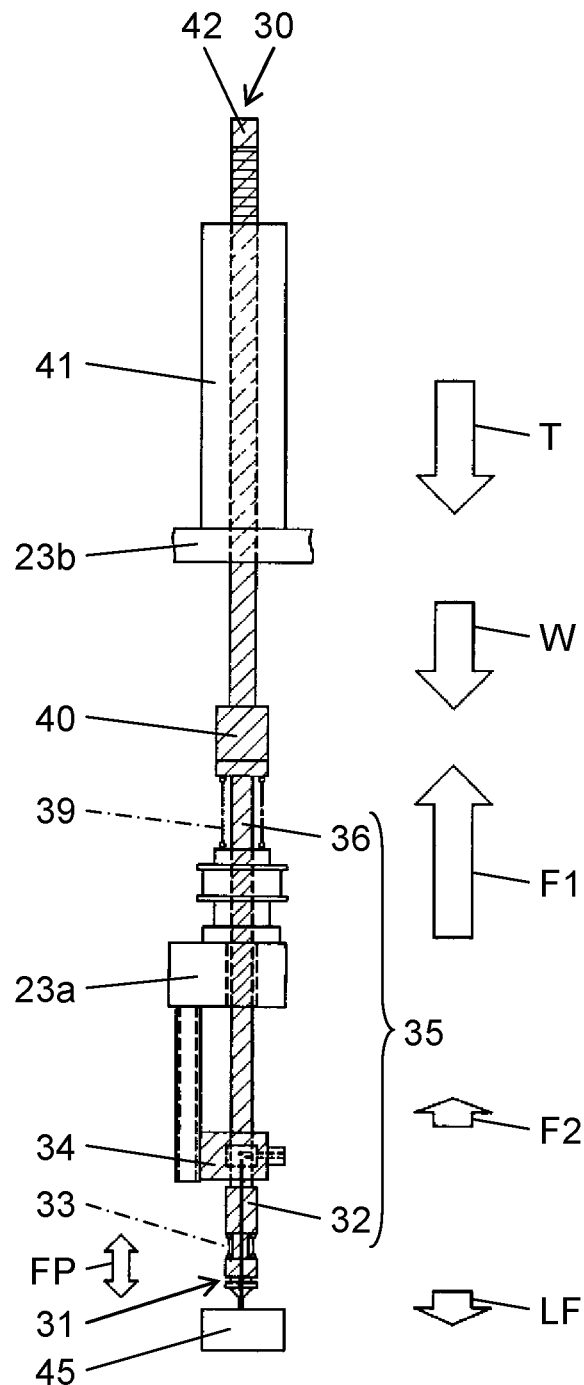
FIG. 10 is an explanatory view illustrating a relationship of a force that acts on the nozzle unit of the component placing device according to the embodiment of the disclosure.

Here, the relationship of forces that acts on nozzle unit 30 having the above-described configuration will be described with reference to FIG. 10. In FIG. 10, thrust T is a thrust generated by servo motor 41 and acts in a direction to push coupled shaft 35 downward via rotating member 40. Weight W is the sum of the weights of the hatched parts indicating a movable portion in the drawing, that is, moving rod 42, rotating member 40, upper portion 36, air joint 34, lower portion 32, component holder 31 and the like, and similar to thrust T, weight W acts in the direction of pushing shaft 35 downward.

Reaction force F1 is a reaction force of return spring 39 and acts in a direction of pushing shaft 35 upward via rotating member 40. Resistance F2 is a resistance external force of a sliding guide or the like that slidably holds the above-described movable portion, and acts upward on shaft 35 driven in a lowering direction. In addition, load LF indicates a load when pressing a contact to which component holder 31 is lowered and abuts, for example, component P held by component holder 31 to the board.

In FIG. 10, in order to acquire thrust-load correlation data (refer to FIG. 11), a state where component holder 31 is pressed against load detector 45 (refer to FIGS. 8 and 9) having a function of measuring load LF, respectively, is illustrated. In addition, biasing force FP illustrated in FIG. 10 is the pressurization value of biasing member 33 interposed between component holder 31 and lower portion 32, and indicates the pressing force exerted on component holder 31 and lower portion 32.

In a force application state described above, load LF is expressed by a relationship illustrated in an equation (1) in the drawing, that is, LF=T+W−F1−F2. Here, since weight W, reaction force F1, and resistance F2 may be regarded as fixed values for same nozzle unit 30, load LF uniquely depends on thrust T. In component placing device 1 illustrated in the embodiment, thrust T is set such that biasing force FP and load LF satisfy an inequality (2), that is, such that load LF is smaller than biasing force FP.

Setting thrust T such that load LF is smaller than biasing force FP has the following technical significance. In other words, in the related art, biasing member 33 plays a role of elastically supporting component holder 31, and when the component held by component holder 31 is placed, the component is pressed to the board by the reaction force generated as biasing member 33 is pushed in.

On the other hand, in component placing device 1 illustrated in the embodiment, a limit value of load LF such that load LF for pushing down component holder 31 is smaller than biasing force FP of biasing member 33 is first defined as limit load LFL. In addition, thrust T of servo motor 41 that corresponds to limit load LFL is obtained as thrust limit value TL and stored in placing head controller 13. In addition, when driving servo motor 41 in the actual component placing operation, servo motor 41 is controlled such that thrust T does not exceed thrust limit value TL.

By controlling thrust T of servo motor 41 in nozzle unit 30 in this manner, it is possible to place the component on the board by the pressing force of load LF itself without compressing biasing member 33 in a lowering operation of component holder 31. Accordingly, even in a case where there are variations in the height of the board depending on the component installation position, it is possible to press the component to the board with load LF that can be controlled with high accuracy.

In addition, in order to control thrust T, in the embodiment, in placing head controller 13 that controls the operation of nozzle unit 30 of placing head 11, thrust limit value TL that limits the value of thrust T of servo motor 41 is set for each servo motor 41, and servo motor 41 is controlled based on set thrust limit value TL. The setting of thrust limit value TL is performed by referring to limit load LFL included in a command from main body controller 14 of the main body of component placing device 1 as the thrust-load correlation data (refer to FIG. 11) created in advance. Hereinafter, with reference to FIG. 8, a configuration in which controller 15 including placing head controller 13 and main body controller 14 is provided in order to execute the control processing in component placing device 1 will be described.

Figure 8:
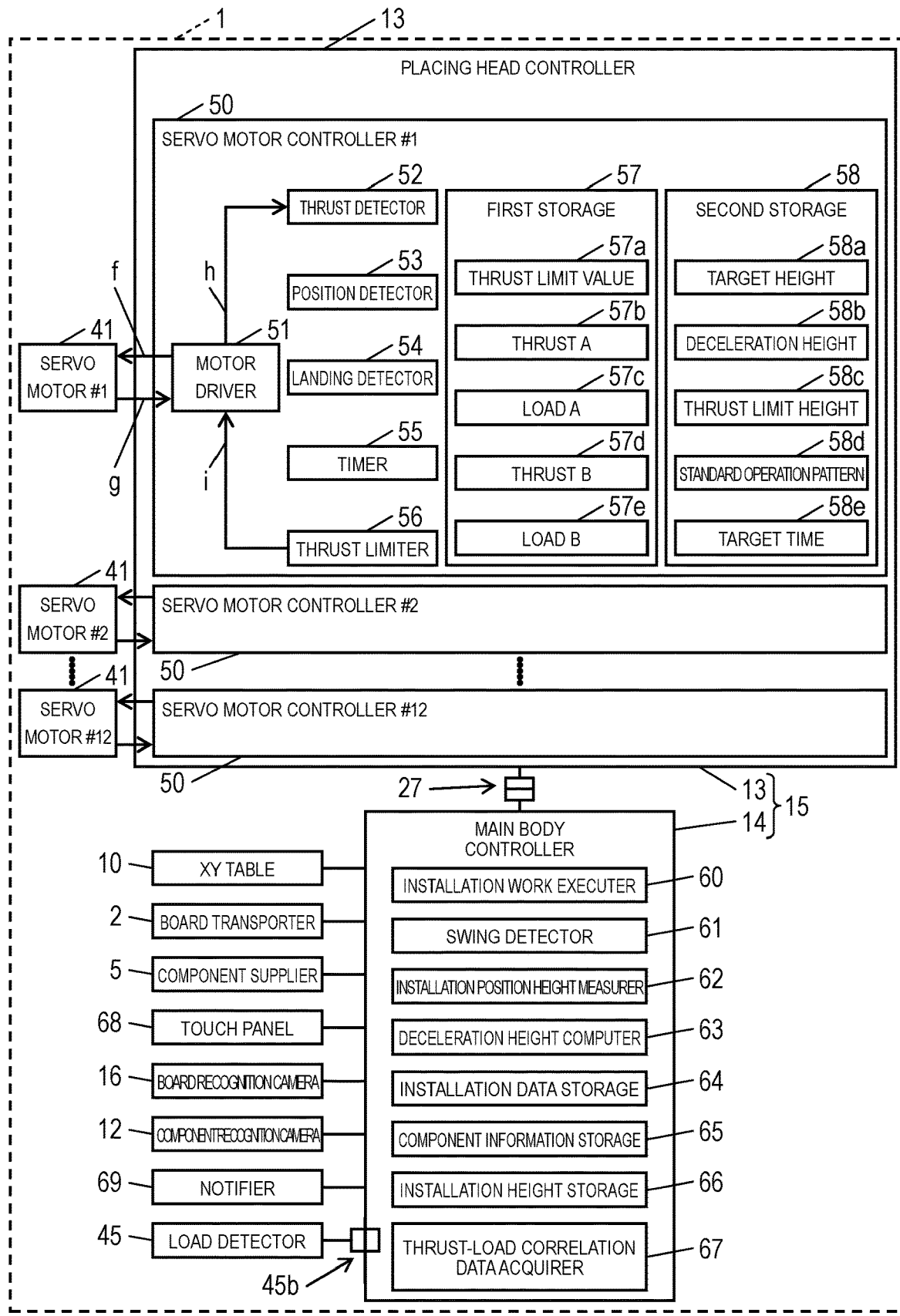
FIG. 8 is a block diagram illustrating a configuration of a control system of the component placing device according to the embodiment of the disclosure.

In FIG. 8, controller 15 for controlling entire component placing device 1 is configured with placing head controller 13 connected to main body controller 14 and main body controller 14 via wiring connector 27. Main body controller 14 has a function of controlling operations, such as transporting board 3 in component placing device 1 and picking up the components from component supplier 5 by placing head 11, and sending a control command to placing head controller 13.

In other words, main body controller 14 controls at least XY table 10 (placing head moving mechanism) for moving placing head 11 and sends a command for performing the raising and lowering operation of component holder 31 to placing head controller 13. In other words, controller 15 controls servo motor 41 that raises and lowers shaft 35 of nozzle unit 30 based on the operation pattern set in advance and stored as "standard operation pattern" 58*d* in second storage 58, and accordingly, causes component holder 31 to perform the raising and lowering operation for placing the component held in component holder 31 on board 3.

Servo motor controllers 50 (#1 to #12) that control servo motors 41 (#1 to #12) of nozzle unit 30 are provided for each of the plurality (here, 12) of nozzle units 30 disposed in placing head 11 are provided in placing head controller 13. Each servo motor controller 50 includes motor driver 51, thrust detector 52, position detector 53, landing detector 54, timer 55, thrust limiter 56, first storage 57, and second storage 58.

Here, as described above, placing head 11 is configured to be attachable to and detachable from XY table 10 which is a placing head moving mechanism, and first storage 57 is a nonvolatile storage. With the configuration, even in a state where placing head 11 is detached from X-axis moving table 9 of XY table 10 and becomes a single unit, the stored contents can be held. Accordingly, even in a case where placing head 11 detached from one component placing device 1 is moved to another component placing device 1, each nozzle unit 30 of placing head 11 can be correctly operated with reference to the correlation data stored in first storage 57.

Motor driver 51 is a drive control device of servo motor 41, supplies (arrow f) electric power to servo motor 41 based on the preset operation pattern, and drives servo motor 41. In addition, a deviation from a target position or a target speed determined by the operation pattern is detected by a pulse signal sent from encoder 44 of servo motor 41 (arrow g), and servo motor 41 is driven by servo control for feeding back the detected deviation.

Thrust detector 52 has a function of detecting the thrust of servo motor 41. In other words, thrust generated in servo motor 41 is detected by the current (arrow f) supplied from motor driver 51 to servo motor 41 or the current value (arrow h) notified from motor driver 51. In the embodiment, the thrust of servo motor 41 is limited by the function of thrust limiter 56 based on thrust limit value TL described above.

Thrust limiter 56 obtains thrust limit value TL with reference to limit load LFL included in the control command from main body controller 14 as the thrust-load correlation data stored in first storage 57 which is the correlation data storage, and store thrust limit value TL as "thrust limit value" 57*a* in first storage 57. In addition, processing for setting obtained thrust limit value TL in motor driver 51 is executed (arrow i).

In other words, when component holder 31 is lowered and reaches thrust limit height TLh (refer to FIG. 13) set in advance as "thrust limit height" 58*c* in second storage 58, thrust limit value TL stored as "thrust limit value" 57*a* in first storage 57 is set in motor driver 51. In addition, when component holder 31 moves up to a position higher than thrust limit height TLh, the setting of thrust limit value TL in motor driver 51 is released.

In the configuration, thrust limiter 56 and motor driver 51 set thrust limit value TL for limiting the thrust of servo motor 41 based on the thrust-load correlation data and information on limit load LFL included in the control command from main body controller 14, and when lowering component holder 31 toward board 3, thrust limiter for limiting the thrust of servo motor 41 to be equal to or lower than thrust limit value TL is configured. Here, thrust limit value TL is set within a range in which the load that acts on the component from component holder 31 when driving servo motor 41 with the same thrust as thrust limit value TL is smaller than biasing force FP by which biasing member 33 which is an elastic body biases component holder 31.

In addition, thrust limiter of the above-described configuration sets thrust limit value TL for limiting the thrust of servo motor 41 within a range that load LF that acts on the component from component holder 31 when servo motor 41 is driven is smaller than biasing force FP by which biasing member 33 biases component holder 31, and limits the thrust of servo motor 41 to be equal to or lower than thrust limit value TL. Specifically, in the driving of servo motor 41 by motor driver 51, the current to be supplied to servo motor 41 is limited such that the thrust becomes equal to or lower than thrust limit value TL.

Position detector 53 counts encoder pulses from encoder 44 of servo motor 41. The count value is positional information indicating the position in the height direction of component holder 31. In other words, position detector 53 has a height position measurement function of detecting the position in the height direction of component holder 31 based on the position signal from servo motor 41. The installation position height measurement described later is performed by using the height position measurement function of position detector 53.

Landing detector 54 detects that the component held by component holder 31 has landed on board 3. The landing detection is performed by any of the following two methods. First, as one method, when thrust detector 52 detects that thrust T of servo motor 41 has reached set thrust limit value TL while thrust limit value TL is set and thrust T is limited by thrust limiter described above, it is detected that the component has landed on board 3. In addition, as an alternative method to the method, it may also be detected that the component has landed on board 3 due to the stagnation of the encoder pulse output from encoder 44 of servo motor 41.

Timer 55 has a function of measuring the elapsed time after the landing detector 54 detects the landing. Then, when the measured elapsed time is set in advance as an appropriate settling time and reaches "target time" 58e stored in second storage 58, component holder 31 starts to rise. In the embodiment, placing head controller 13 of controller 15 controls servo motor 41 and raises component holder 31 when the elapsed time reaches "target time" 58e before a raising start timing determined by the operation pattern stored in "standard operation pattern" 58d of second storage 58.

First storage 57 is a correlation data storage, and stores correlation data (thrust-load correlation data) indicating the relationship between thrust T of servo motor 41 and load LF generated at a tip end of component holder 31 for each of the plurality of servo motors. In addition, first storage 57 is a nonvolatile storage and can hold the stored contents even in a state where placing head 11 is detached from XY table 10.

Figure 11:
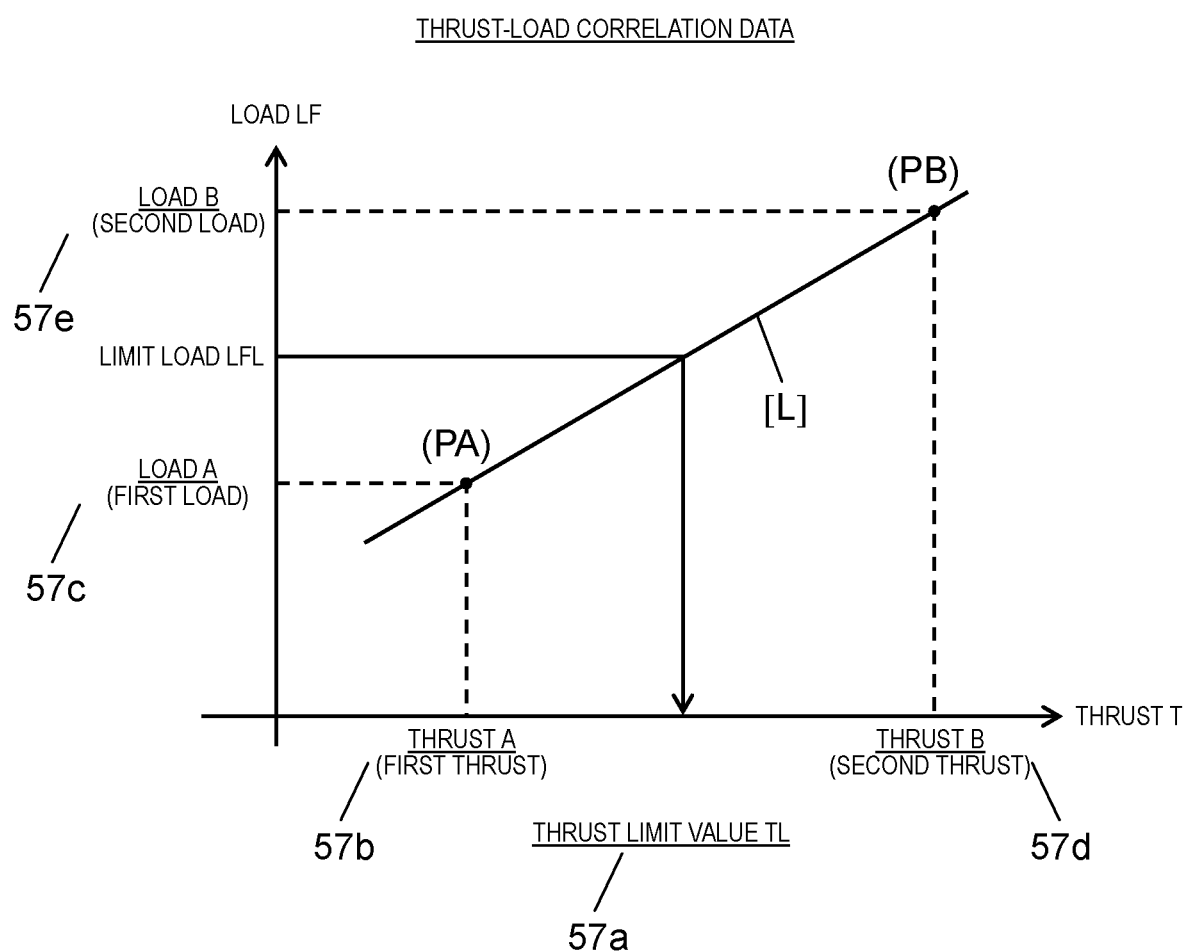
FIG. 11 is an explanatory view of thrust-load correlation data illustrating a correlation between a thrust of a servo motor and a load by the component holder in the component placing device according to the embodiment of the disclosure.

With reference to FIG. 11, the contents of the above-described thrust-load correlation data will be described. FIG. 11 is a graph in which the horizontal axis indicates thrust T of servo motor 41 and the vertical axis indicates load LF generated at the tip end of component holder 31. In nozzle unit 30 having the configuration illustrated in FIG. 10, thrust T and load LF are in a linear relationship in a practical target section, and in the graph of FIG. 11, thrust T and load LF are in a relationship expressed by characteristic straight lines [L].

The characteristic straight line [L] is obtained as follows. First, load A and load B generated at the tip end of component holder 31 when servo motor 41 is driven with two thrusts A and B having different sizes are measured by load detector 45 illustrated in FIG. 9. In addition, in FIG. 11, a straight line that connects two data points (PA) and (PB) defined by (thrust A, load A) and (thrust B, load B) is taken as characteristic straight line [L].

In addition, when limit load LFL is specified by the control command transmitted from main body controller 14 at the time of executing the component placing operation, thrust that corresponds to limit load LFL on the characteristic straight line [L] is obtained as thrust limit value TL. In other words, limit load LFL applied to component P by component holder 31 when placing component P on board 3 and thrust limit value TL for limiting thrust T generated by servo motor 41 using the thrust-load correlation data illustrated in FIG. 11 are calculated. The obtained thrust limit value TL is stored as "thrust limit value" 57a in first storage 57 which is the correlation data storage for each of the plurality of servo motors.

In the driving of servo motor 41 in the component placing operation, thrust limit value TL stored in this manner is set in motor driver 51 at a predetermined timing, and the thrust is controlled such that the thrust of servo motor 41 is equal to or lower than thrust limit value TL. With the configuration, in component placing device 1 including the plurality of component holders 31 and servo motor 41, it is possible to reduce variations in the load caused by variations in characteristics of servo motor 41.

In the above-described thrust-load correlation data, thrust A is a first thrust and load A is a first load generated when servo motor 41 is driven with the first thrust. In addition, thrust B is a second thrust having a size different from the first thrust and load B is a second load generated when servo motor 41 is driven with the second thrust. In first storage 57, the thrust-load correlation data is stored in a form of a digital value indicating "thrust limit value" 57a, "thrust A" 57b, "load A" 57c, "thrust B" 57d, and "load B" 57e.

In addition, load A which is the first load and load B which is the second load are set so as to be smaller than biasing force FP for biasing component holder 31 by biasing member 33 which is the elastic body. Accordingly, in the load measurement using load detector 45, it is possible to measure load LF without compressing biasing member 33, and to correctly obtain the correlation between the thrust and the load.

Second storage 58 stores work execution data transmitted from main body controller 14 to placing head controller 13, such as a height parameter for raising and lowering operation control in the installation operation or an operation pattern. These working execution data are created by installation work executer 60 of main body controller 14 based on the installation data for each board type illustrated in the following FIG. 12B, and are transmitted to placing head controller 13.

Figures 12A, 12B:
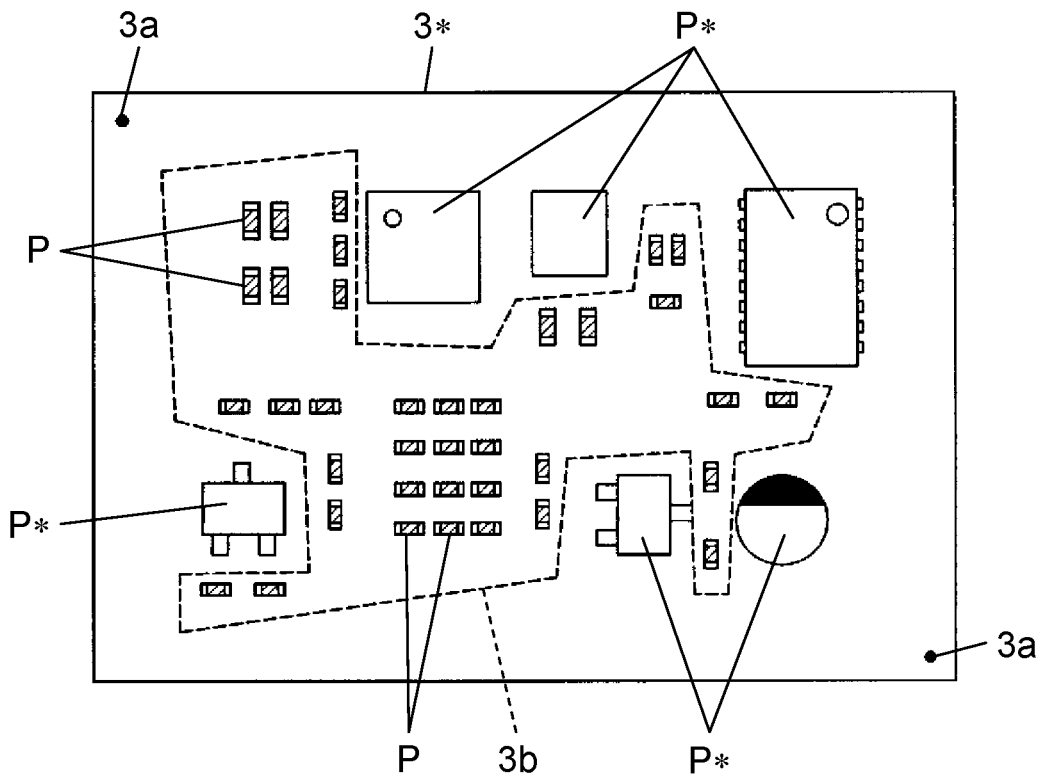
FIG. 12A is an explanatory view of a board which is a work target and installation data of the board of the component placing device according to the embodiment of the disclosure.
FIG. 12B is an explanatory view of the board which is a work target and the installation data of the board of the component placing device according to the embodiment of the disclosure.

FIG. 12A illustrates component placing board 3* manufactured by placing the component on board 3 by a component mounting system including component placing device 1 illustrated in the embodiment. On the component mounting surface on which recognition mark 3a is formed on board 3, component placing range 3b which is a target of component placement by component placing device 1 is set. In component placing range 3b, component P is placed by component placing device 1. In a range on the outside of component placing range 3b, component P* is placed by another component placing device.

FIG. 12B illustrates installation data 70 which is referred to when placing component P in component placing range 3b by component placing device 1. Installation data 70 is stored in installation data storage 64 of main body controller 14. Installation data 70 includes: "installation position No" 70a that indicates the number of installation position of component P on board 3 by MP1, MP2, . . . ; "installation position coordinates (X, Y, θ)" 70b that indicates installation position coordinates of component P in each "installation position No" 70a; "installation position height (Z)" 70c that indicates the installation position height of component P in each "installation position No" 70a; and "component name" 70d that indicates the name of installed component P.

Figure 13:
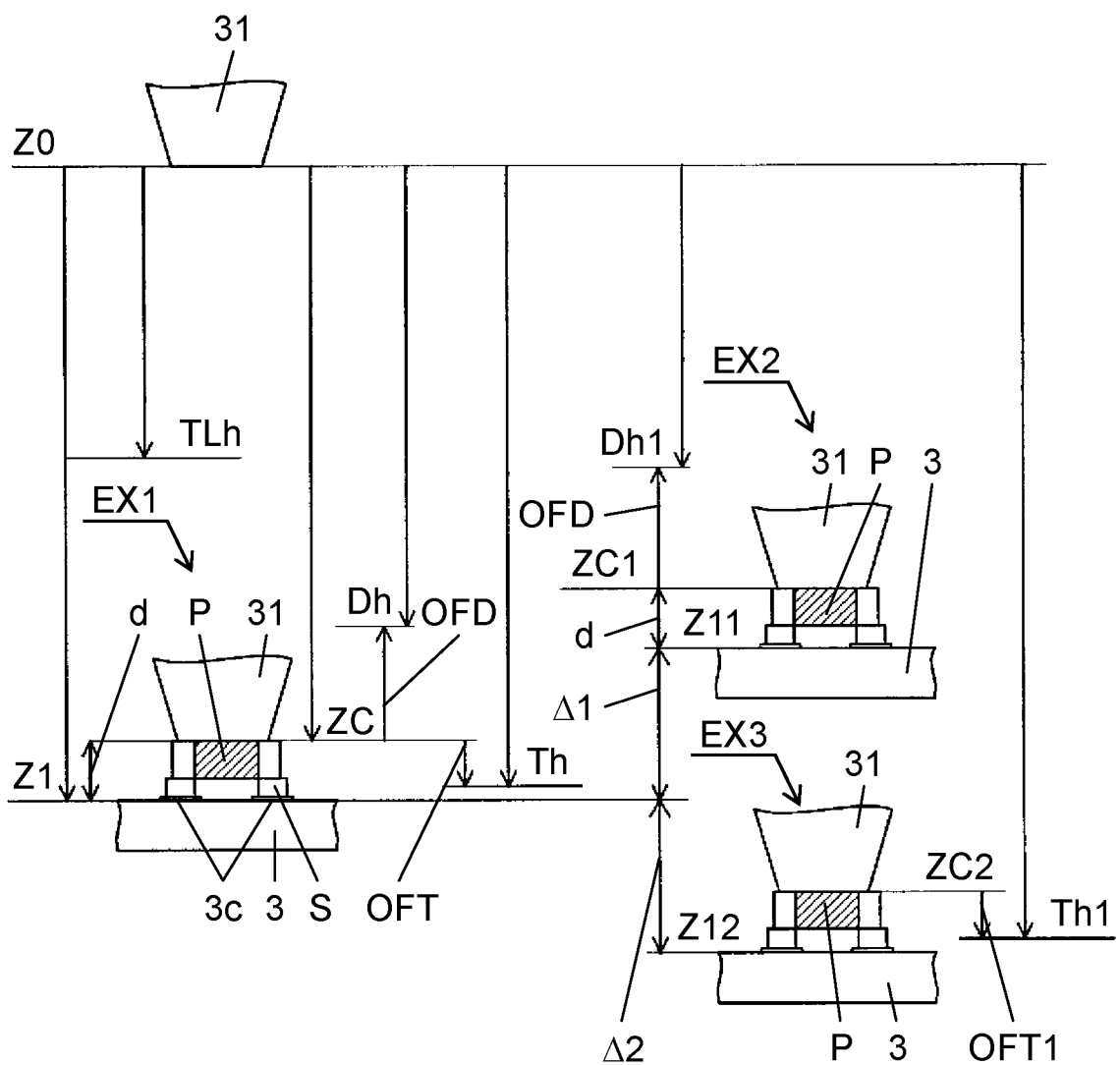
FIG. 13 is an explanatory view of a height parameter for raising and lowering operation control in the installation operation of a component by the component placing device according to the embodiment of the disclosure.

Next, the height parameter for raising and lowering operation control included in these work execution data will be described with reference to FIG. 13. FIG. 13 schematically illustrates the positional relationship of the height parameters for control when servo motor 41 lowers shaft 35 (refer to FIG. 5) on which component holder 31 that holds component P is installed. In FIG. 13, the horizontal line drawn above indicates standby height Z0 which is the position before starting the operation of component holder 31.

In first example EX1 illustrated on the lower left side, the installed state of component P in the ideal state is illustrated. In other words, here, a state where board 3 which is in an ideal state without deformation is set in the board holder at which the height is held correctly, and component holder 31 that holds component P is lowered with respect to board 3, is illustrated. The upper surface of board 3 in the state indicates the mounting height Z1 in the ideal state. Thrust limit height TLh which is the height at which thrust limit value TL is applied and thrust limit for limiting the thrust of servo motor 41 is started is set in the middle between standby height Z0 to installation height Z1, and is stored in second storage 58 of placing head controller 13 in advance.

In addition, the height above installation thickness dimension d (here, a thickness dimension obtained by adding the thickness of component P, the thickness of land 3c, and the thickness of joining solder S) from installation height Z1, is landing height ZC that indicates the height of component holder 31 when component P held by component holder 31 is in contact with the joining solder. In addition, the position above landing height ZC by predetermined deceleration height offset OFD is deceleration height Dh that defines a deceleration position for decelerating the lowering speed of component holder 31 from high speed to low speed. Further, the position below target height offset OFT in consideration of the prevention of swing from landing height ZC is target height Th which is a target for lowering component holder 31.

Here, regarding deceleration height Dh, it is desirable to reduce deceleration height offset OFD as small as possible from the viewpoint of shortening the lowering time of component holder 31 to improve the productivity, and to set deceleration height Dh to be a height close to landing height ZC. However, in a case where mounting height Z1 of board 3 of work target varies, the following inconvenience occurs depending at the installation position of deceleration height Dh.

In other words, when the deceleration height Dh is extremely low, there is a concern about placement trouble due to the landing of component P held by component holder 31 without reducing the lowering speed. Conversely, when deceleration height Dh is extremely high, there is a delay in operation time due to deceleration of the lowering speed from a timing that is earlier than necessary. In order to prevent such inconvenience, in component placing device 1 described in the embodiment, based on the actual installation height detected by the function of position detector 53 in the execution process of the component placing work, an appropriate deceleration height is dynamically set.

In second example EX2 and third example EX3 which are illustrated on the right side of first example EX1, indicates an installation state of component P in a state where the height position of board 3 is displaced upward only by variation 41 and downward by variation 42 from board 3 which is in the ideal state. The upper surface of board 3 in second example EX2 illustrates installation height Z11 in this state. In addition, the height above from installation height Z11 only by installation thickness dimension d described above is landing height ZC1, and the position above from landing height ZC1 only by the predetermined deceleration height offset OFD is deceleration height Dh1.

The upper surface of board 3 in third example EX3 illustrates installation height Z12 in this state. In addition, the height above from installation height Z12 only by installation thickness dimension d is landing height ZC2, and the position below from landing height ZC1 only by target height offset OFT1 is target height Th1 which is a target at which component holder 31 is lowered. Here, even in a case where the height of the assumed installation position is the lowest, the height is set such that the swinging does not occur. In addition, in second example EX2, illustration of the target height is omitted, and in third example EX3, illustration of the deceleration height is omitted.

The height parameters are stored in second storage 58. Here, target height Th and deceleration height Dh are set for each operation of nozzle unit 30 in placing head 11. In addition, "target height" 58a which is a target lowering height when component holder 31 is lowered in the component placing operation, and "deceleration height" 58b which is a height that defines the timing for decelerating the speed of lowering component holder 31 from high speed to low speed, are stored after being updated each time. In addition, thrust limit height TLh is stored as "thrust limit height" 58c.

"Standard operation pattern" 58d is an operation pattern of the installation operation in placing the component by placing head 11 with respect to board 3 which is a target. The operation pattern includes a deceleration height for decelerating the speed of lowering component holder 31 from high speed to low speed and a target height which is a target lowering height of component holder 31.

"Target time" 58e is a settling time for maintaining a settled state where component holder 31 that holds component P is lowered and presses component P against board 3. In the embodiment, when the elapsed time obtained by measuring elapsed time after landing detector 54 detects the landing by landing detector 54 reaches target time Ts stored as "target time" 58e, component holder 31 is separated from moved from component P and is raised.

Main body controller 14 is connected with XY table 10, board transporter 2, component supplier 5, touch panel 68, board recognition camera 16, component recognition camera 12, notifier 69, and load detector 45. Main body controller 14 includes installation work executer 60, swing detector 61, installation position height measurer 62, deceleration height computer 63, installation data storage 64, component information storage 65, installation height storage 66, and thrust-load correlation data acquirer 67, as internal processing functional sections.

Based on the installation data (refer to FIG. 12B) stored in installation data storage 64, installation work executer 60 controls XY table 10, board transporter 2, component supplier 5, placing head 11, component recognition camera 12, and board recognition camera 16. Accordingly, a series of work (refer to the flow illustrated in FIG. 19) for placing component P on board 3 is executed. Touch panel 68 is an operation input for displaying an input operation and an operation screen at the time of an input operation, and performs the input operation required when the above-described series of operations is executed. Notifier 69 is notifying means, such as a signal tower operating in a predetermined situation, a display screen, and the like, and in a case where an abnormal state is detected in the component placing operation by placing head 11, the fact is notified.

Figure 9:
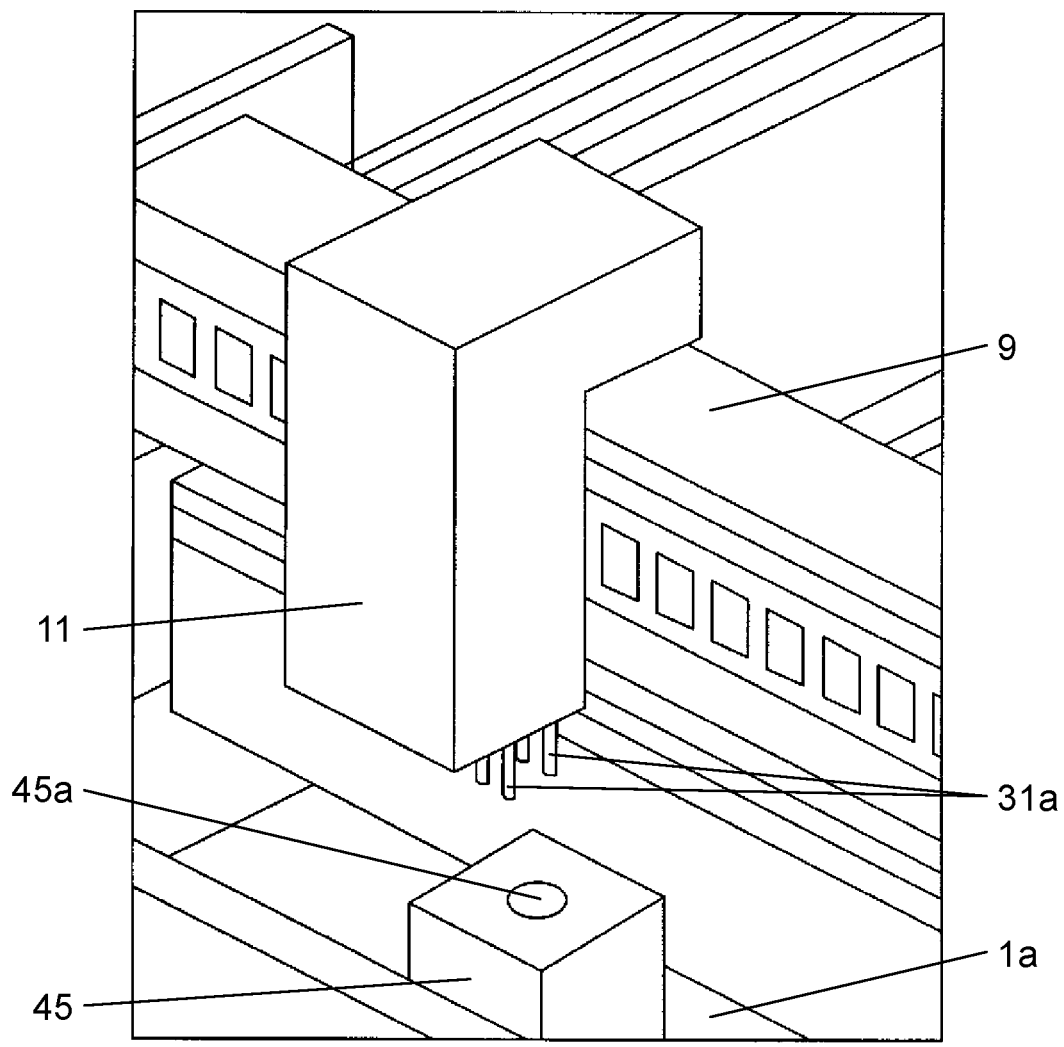
FIG. 9 is an explanatory view of a disposition state of a load detector in the component placing device according to the embodiment of the disclosure.

Load detector 45 is a detection unit having a function of detecting load LF illustrated in FIG. 10. As illustrated in FIG. 9, load detector 45 includes load detecting device 45a, such as a load cell, on the upper surface thereof, and the lower end portion of component holder 31 is brought into contact with load detecting device 45a and pressed to measure load LF. Load detector 45 can be detachably connected to main body controller 14 via connector device 45b. When the load measurement is required, as illustrated in FIG. 9, load detector 45 is disposed on base 1a of placing head 11.

After the thrust limiter of the above-described configuration limits the thrust of servo motor 41, swing detector 61 detects that the thrust detected by thrust detector 52 has not reached set thrust limit value TL during a period to the raising start timing determined by the operation pattern set in advance, that is, that the component held by component holder 31 has not reached the upper surface of the board and the placing operation became "swing".

In addition, in a case of detecting the swing by swing detector 61, notifier 69 is operated to notify the fact. In the embodiment, it is possible to immediately detect "swinging" with a high possibility of mounting failure, and by notifying the fact, it is possible to rapidly perform response, such as prediction of the occurrence of a defect or correction of the target height of the component, and to stabilize the quality.

Installation position height measurer 62 measures the installation height indicating the height at an installation completion position which is the installation position at which component P is installed, based on the position in the height direction of component holder 31 detected by position detector 53 and the dimension of component P installed by component holder 31, at a predetermined timing from the time when the component reaches the installation position of board 3 until immediately before component holder 31 starts raising. The plurality of measured installation heights of the plurality of installation completion positions are stored in installation height storage 66.

Deceleration height computer 63 uses at least one installation height stored in installation height storage 66 to calculate the deceleration height (refer to deceleration height Dh2 illustrated in FIG. 17B) when the component is installed at an uninstallation position which is an installation position where the component has not yet been installed. In other words, in the embodiment, based on the installation height detected by position detector 53 with respect to the installation completion position on which the installation has already been executed on the same board 3, the correction is performed by calculating the deceleration height for the uninstallation position which is the work target thereafter.

Figure 18A:
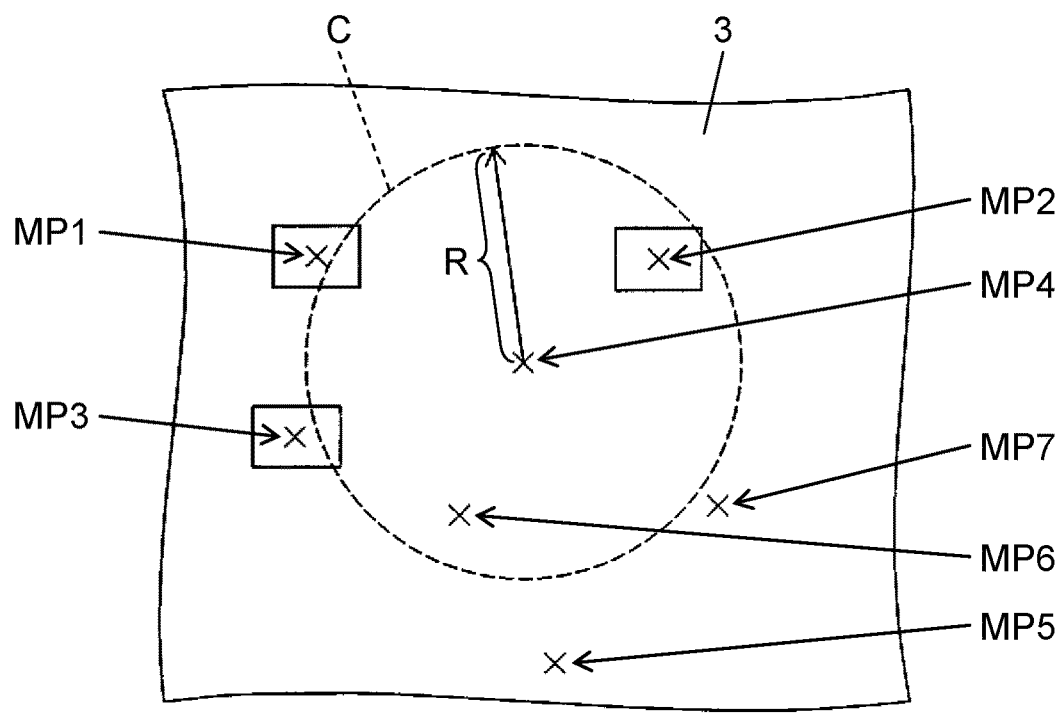
FIG. 18A is an explanatory view illustrating a correction target position of deceleration height correction in the third example of the installation operation of the component by the component placing device according to the embodiment of the disclosure.
Figure 18B:
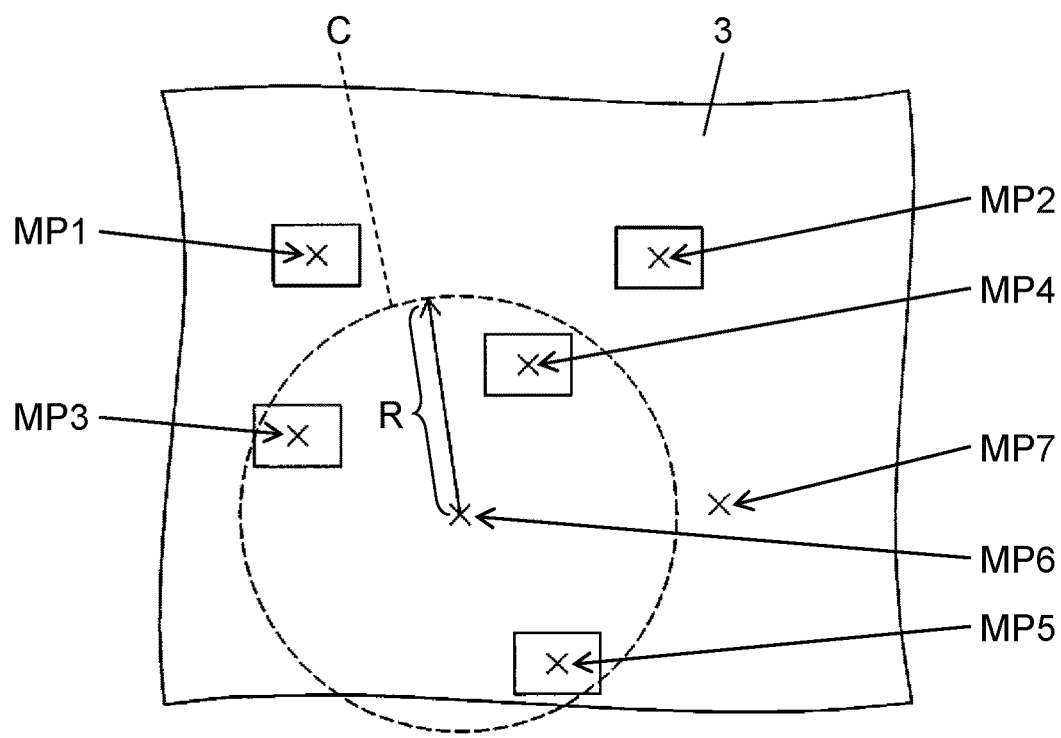
FIG. 18B is an explanatory view illustrating the correction target position of the deceleration height correction in the third example of the installation operation of the component by the component placing device according to the embodiment of the disclosure.

Here, with reference to FIGS. 18A and 18B, an example of the deceleration height correction by deceleration height computer 63 will be described. FIGS. 18A and 18B illustrate correction target positions of deceleration height correction. In FIGS. 18A and 18B, on the upper surface of board 3, a plurality of installation positions MP1 to MP7 to which the components are installed are set. Among the installation positions, the installation position enclosed by a rectangular frame indicates the installation completion position which is the installation position where component P is installed.

In FIG. 18A, installation positions MP1, MP2, and MP3 are the installation completion positions, and installation position MP4 is the uninstallation position which becomes a target of the next installation operation. When setting the new deceleration height by the calculation instead of the preset deceleration height for installation position MP4 which is the uninstallation position, it is determined whether or not the installation completion position exists within the range (here, within circular range C of radius R around installation position MP4) set in advance from the uninstallation position (installation position MP4).

In addition, in a case where the installation completion position exists, the deceleration height for the uninstallation position (here, installation position MP4) is computed based on the installation height measured for the installation completion position (here, installation position MP2). In other words, in this case, deceleration height computer 63 computes the deceleration height based on the installation height of the installation completion position that exists within the range preset from the uninstallation position. Deceleration height computer 63 calculates the installation height of installation position MP4 from the installation height of installation position MP2. As an example, in a case where the installation height of installation position MP2 is different from the installation height originally assumed, after assuming that the installation height of installation position MP 4 that exists in the vicinity thereof is also similarly different, installation height Z11 (refer to FIG. 13) of installation position MP4 is calculated. In addition, deceleration height computer 63 computes deceleration height Dh2 at installation position MP4 using the installation thickness dimension d of installation height Z11 and installation position MP4 and deceleration height offset OFD.

In addition, under the condition whether or not the installation completion positions exist more than the preset number in the vicinity of the uninstallation position that becomes that target of the installation operation, it may be determined whether or not the computation of the deceleration height is possible. In FIG. 18B, installation positions MP1, MP2, MP3, MP4, and MP5 are the installation completion positions, and installation position MP6 is the uninstallation position which becomes a target of the next installation operation. When setting the new deceleration height by the calculation instead of the preset deceleration height for installation position MP6 which is the uninstallation position, it is determined whether or not the preset number (here, 3) of installation completion positions exist within the range (here, within circular range C of radius R around installation position MP6) set in advance from the uninstallation position (installation position MP6).

In addition, in a case where the preset number or more of installation completion positions exist, the deceleration height for the uninstallation position (here, installation position MP6) is computed based on the installation height measured for the installation completion position (here, installation positions MP3, MP4, and MP5). In other words, in this case, deceleration height computer 63 computes the deceleration height of the uninstallation position based on the installation height of the preset number of installation completion positions. In the calculation, for example, installation height Z11 of installation position MP6 is calculated from the average value of the plurality of installation heights. In addition, deceleration height computer 63 computes deceleration height Dh2 at installation position MP6 using the installation thickness dimension d of installation height Z11 and installation position MP6 and deceleration height offset OFD.

Installation data storage 64 stores the installation data (refer to FIG. 12B), such as the installation position coordinates of component P on board 3 that becomes the placing work target by component placing device 1. Component information storage 65 stores component information that indicates the model number, dimension or the like of component P placed on board 3. Installation height storage 66 stores the plurality of installation heights of the plurality of installation completion positions measured by installation position height measurer 62.

Thrust-load correlation data acquirer 67 performs processing for acquiring the thrust-load correlation data illustrated in FIG. 11. In other words, as illustrated in FIG. 9, placing head 11 is accessed to load detector 45 prepared at a predetermined position of base 1a, servo motor 41 of nozzle unit 30 which is a measurement target is driven with a prescribed thrust, and component holder 31 is pressed against load detecting device 45a of load detector 45, and load LF that corresponds to the thrust at this time is measured. The measurement result is transmitted to placing head controller 13 as the thrust-load correlation data and stored in first storage 57 that serves as the correlation data storage.

As described above, in the embodiment, placing head controller 13 is configured to include first storage 57 that serves as the correlation data storage and the above-described thrust limiter. Here, first storage 57 stores the correlation data indicating the relationship between the thrust of servo motor 41 and load LF generated at the tip end of component holder 31 for each of the plurality of servo motors. In addition, the thrust limiter sets thrust limit value TL for limiting the thrust generated by servo motor 41 based on the correlation data stored in first storage 57 and information on the load included in the command from main body controller 14, and when lowering component holder 31 toward board 3, thrust limiter has a function of limiting the thrust of servo motor 41 to be equal to or lower than thrust limit value TL. By providing placing head controller 13 having such a configuration, it is possible to stably control the installation load with high accuracy in the configuration having servo motor 41 for each of the plurality of component holders 31.

Here, a component placing method for manufacturing the component placing board by creating the thrust-load correlation data illustrated in FIG. 11, by using placing head 11 including servo motor 41 that raises and lowers component holder 31, and by placing the component on board 3. In the component placing method, first, as illustrated in FIG. 9, load detector 45 for detecting the load is prepared and disposed below placing head 11. Next, servo motor 41 is driven with a predetermined thrust, the lower end portion (nozzle 31a or a load measuring jig installed instead of nozzle 31a) of component holder 31 is pressed against load detector 45, and the correlation data of thrust T of servo motor 41 and load LF is measured (refer to FIG. 10). Accordingly, characteristic straight line [L] illustrated in FIG. 11 is acquired, and the measured correlation data is stored in first storage 57 which is the correlation data storage.

Next, limit load LFL applied to component P by component holder 31 when placing component P on board 3 and thrust limit value TL for limiting thrust T generated by servo motor 41 using the above-described correlation data are calculated. Limit load LFL is included in the control command transmitted from main body controller 14 to placing head controller 13. When the component installation operation is started, component holder 31 which holds component P is lowered toward the installation position of board 3.

In the lowering operation of component holder 31, thrust T of servo motor 41 is limited to be equal to or lower than thrust limit value TL before component P lands at the installation position. In addition, after component P has landed at the installation position, component holder 31 is raised, component holder 31 is separated from component P that has landed at the installation position, and accordingly one component installation operation in the component placing method is completed. By using such a method, it is possible to set thrust limit value TL for limiting the thrust of servo motor 41 in accordance with limit load LFL by a simple method.

Figure 19:
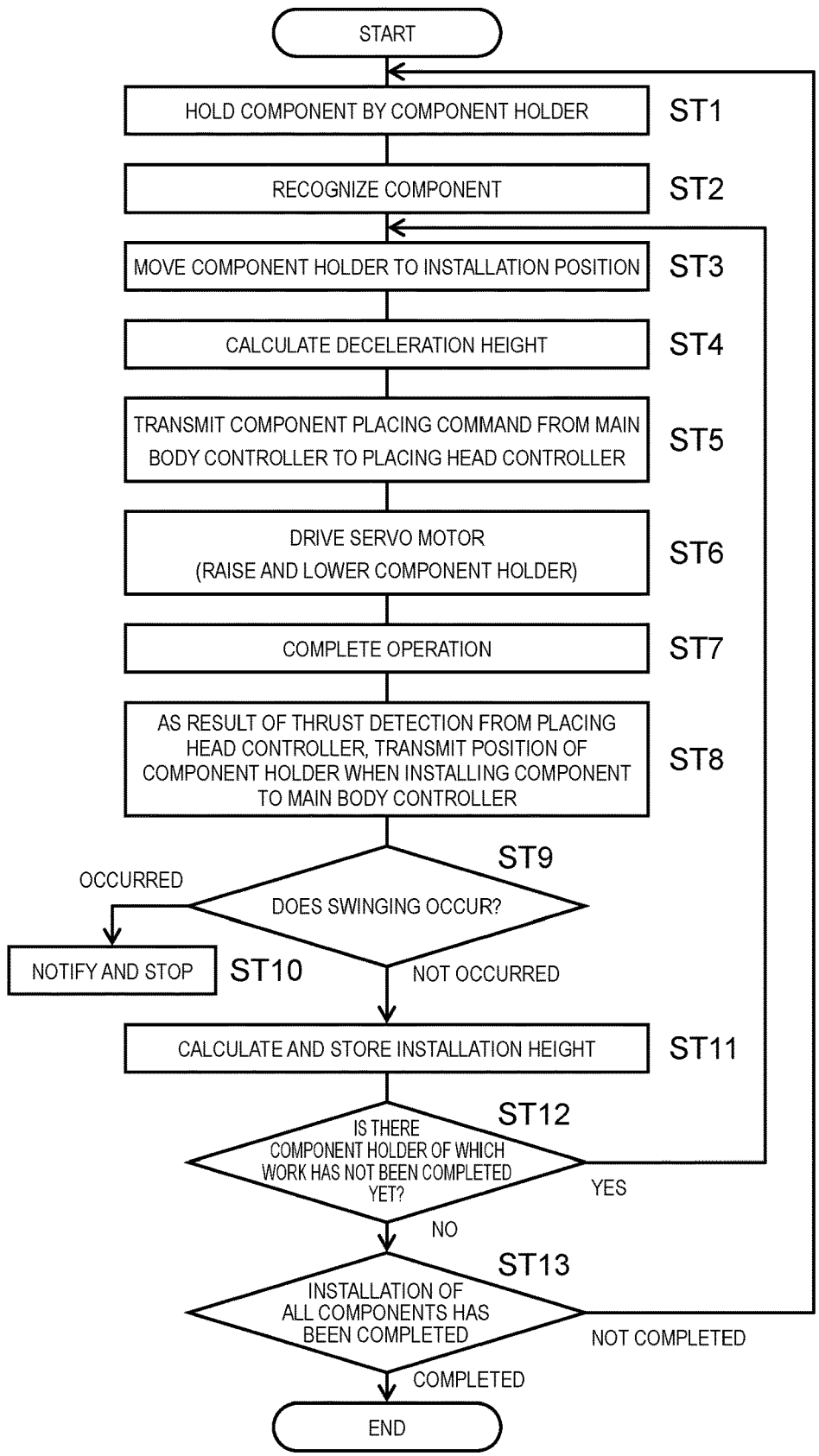
FIG. 19 is a flowchart illustrating component installation work by the component placing device according to the embodiment of the disclosure.

Next, with reference to FIG. 19, component installation processing executed by component placing device 1 having the above-described configuration. In addition, prior to the start of the processing illustrated in FIG. 19, board 3 of the work target is carried into board transporter 2, positioned and held, and becomes in a state where board recognition is executed by board recognition camera 16. When the component installation processing is started, first, placing head 11 is moved to component supplier 5, component holder 31 is lowered, and component holder 31 holds component P which is the installation target (ST1). Next, placing head 11 in which component P is held by component holder 31 is moved to above component recognition camera 12, and component P is recognized by imaging the component by component recognition camera 12 (ST2).

Next, component holder 31 is moved to installation position (ST3). In other words, installation work executer 60 of main body controller 14 controls XY table 10 based on installation data 70 illustrated in FIG. 12B so as to position component holder 31 above the installation position of board 3 designated by the sequence of the installation work. Next, the deceleration height Dh (refer to FIG. 13) in the component installation operation for the installation position is calculated (ST4). The deceleration height calculation is executed only in a case where the installation height of the installation completion position in the vicinity of the installation position has already been measured as described above. In a case where the condition of the above-described deceleration height calculation is not satisfied, such as a case where newly transported board 3 is the target, the processing is skipped and the default deceleration height stored in advance is applied as it is.

Next, a component placing command is transmitted from main body controller 14 to placing head controller 13 (ST5). In other words, a control command including an installation operation parameter, such as a number that identifies component holder 31 in placing head 11 that serves as a work target, target height Th, deceleration height Dh, and limit load LFL, is transmitted to placing head controller 13. In addition, the installation operation parameters are stored in first storage 57 and second storage 58 in order to execute the mounting operation in placing head 11.

After this, the component installation operation by nozzle unit 30 of placing head 11 is executed by the control processing function of placing head controller 13. In the component installation operation, servo motor 41 is driven by servo motor controller 50 (ST6), and accordingly, component holder 31 that holds component P is raised and lowered with respect to the installation position of board 3. In addition, after the predetermined settling time has elapsed after the installation position of board 3 has landed, component holder 31 is raised, and accordingly, the component installation operation is completed (ST7).

In accordance with the completion of the operation, as a result of the thrust detection by thrust detector 52 of servo motor controller 50 in the component installation operation, the installation height of component holder 31 when installing component P detected by position detector 53 is transmitted to main body controller 14 (ST8). In addition, after this, it is determined whether or not the swinging occurs in the above-described component installation operation (ST9). In other words, in the lowering operation of component holder 31, in a case where the thrust detected by thrust detector 52 has not reached the set thrust limit value TL, it is determined that the swinging in which component P held by component holder 31 has not landed on the board occurs, the fact is notified by notifier 69, and the device is stopped (ST10).

In a case where it is determined that the swinging does not occur in (ST9), the installation height of component holder 31 received by main body controller 14 is stored in installation height stage 66 (ST11). Accordingly, component installation operation that considers component holder 31 of one nozzle unit 30 as a target is completed, and the presence and absence of component holder 31 that has not been completed yet is confirmed (ST12). Here, in a case where there is a component holder 31 of which the work has not been completed yet, the process returns to (ST3) and the subsequent processing is iteratively executed. On the other hand, in a case where there is no component holder 31 of which the work has not been completed yet, installation completion of all the components is confirmed (ST13). Here, in a case where the installation has not been completed, the process returns to (ST1) and the subsequent processing is iteratively executed. In addition, in (ST13), the installation completion of all of the components is confirmed, and the component installation processing by component placing device 1 is ended.

Next, a component placing method by component placing device 1 having the above-described configuration will be described with reference to FIGS. 14A to 17B. The plurality of component placing methods illustrated with reference to the drawings is executed by component placing device 1 including controller 15 for causing component holder 31 to perform the raising and lowering operation for placing component P held by component holder 31 at the installation position of board 3 by controlling servo motor 41 based on the preset operation pattern. Each operation illustrated in the component placing method is executed by controlling each portion illustrated in FIG. 8 by controller 15 including placing head controller 13 and main body controller 14, and accordingly, component placing board 3* in which component P is placed on board 3 (refer to FIG. 12A) is manufactured.

In addition, FIGS. 14A to 17B schematically illustrate the raising and lowering operation of component holder 31 in the component installation operation, and the vertical axis corresponds to the vertical displacement of component holder 31 and the horizontal axis corresponds to a passage of time, respectively. In addition, in FIGS. 14A to 17B, TR1 indicated by a thick broken line indicates setting trajectory TR1 where the lower end portion of component holder 31 moves in the preset operation pattern. In addition, TR2 indicated by a bold solid line illustrates real trajectory TR2 where the lower end portion of component holder 31 moves in the actual installation operation illustrated in each drawing.

In addition, in each drawing, timing to is a timing of starting the operation, and indicates a state where component holder 31 is moved above the installation position of board 3 to stand by at standby height Z0. Thrust limit height TLh indicates the thrust limit starting height for limiting the thrust of servo motor 41 to be equal to or lower than thrust limit value TL when component holder 31 is lowered. Landing height ZC indicates the height of component holder 31 when a terminal of held component P is in contact with the solder part supplied to board 3 and component P lands. Further, target height Th1 is a target height of the lowering operation of component holder 31, and considering variation of the installation height of board 3, target height Th1 is set to be lower than the height at which component P actually lands.

Figure 14A:
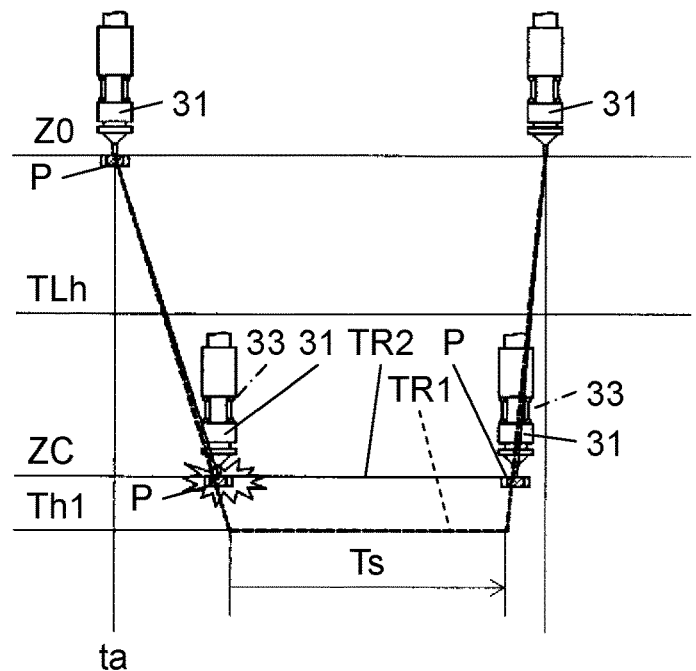
FIG. 14A is an explanatory view of a basic example of the installation operation of the component by the component placing device according to the embodiment of the disclosure.
Figure 14B:
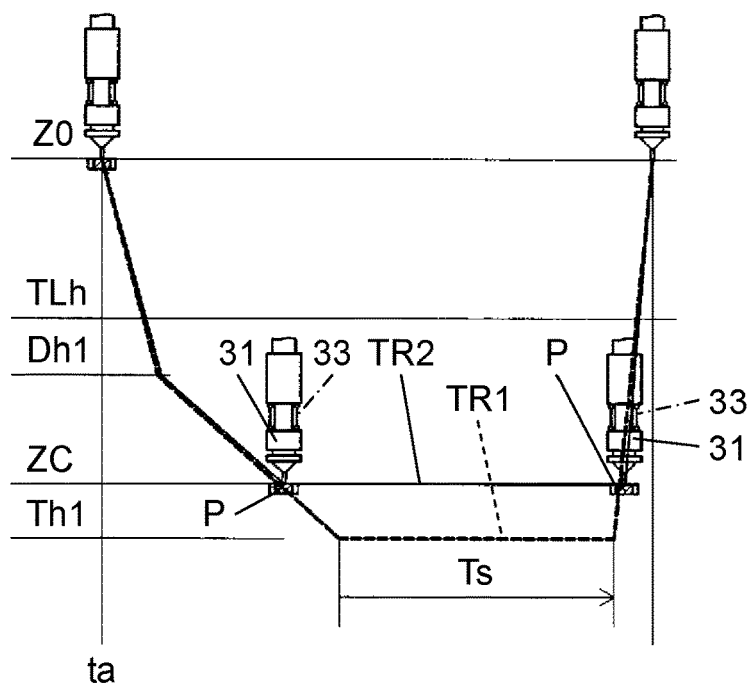
FIG. 14B is an explanatory view of a basic example of the installation operation of the component by the component placing device according to the embodiment of the disclosure.

First, with reference to FIGS. 14A and 14B, basic example M0 of component installation operation by the component placing method will be described. FIG. 14A illustrates high-speed installation mode M0-1 in which component holder 31 is lowered only at high speed in order to shorten the work operation time in basic example M0. In addition, FIG. 14B illustrates low-impact installation mode M0-2 in which the impact when component P held by component holder 31 lands is suppressed as much as possible in basic example M0.

With reference to FIG. 14A, high-speed installation mode M0-1 will be described. Component holder 31 that holds component P moves above the installation position of board 3 and is in the standby state being positioned at standby height Z0 at timing ta. Next, by the function of thrust limiter 56 provided in servo motor controller 50, thrust limit value TL for limiting the thrust of servo motor 41 is set. Here, thrust limit value TL is set within a range in which the load that acts on component P from component holder 31 when driving servo motor 41 by the same thrust as thrust limit value TL is lower than biasing force FP by which biasing member 33 which is an elastic body biases component holder 31.

Next, by controlling servo motor 41 based on the preset operation pattern, component holder 31 is lowered toward the installation position of board 3 with target height Th1 as the target. In the middle of the lowering, the thrust of servo motor 41 is limited to be equal to or lower than thrust limit value TL before component P lands at the installation position at the timing when the height of component holder 31 reaches thrust limit height TLh.

In addition, setting of thrust limit value TL set by thrust limiter 56 provided in servo motor controller 50, the thrust limiting of servo motor 41 at the timing of reaching thrust limit height TLh in the middle of lowering component holder 31, and landing detection for detecting that component P has landed on board 3, are similarly employed even in the first example, the second example, and the third example which are illustrated in FIGS. 15A, 15B, 16A, 16B, 17A, and 17B.

After this, when component holder 31 is further lowered, component holder 31 reaches landing height ZC, the terminal of held component P comes into contact with the solder portion supplied to board 3, and a state where component P has landed is achieved. The impact at landing is absorbed by biasing member 33, and after the impact is absorbed, biasing member 33 returns to the normal length before landing. After this, component holder 31 maintains the pressed state during target time Ts for statically setting the landing state of component P from a pressing start timing preset in the operation pattern. Then, component holder 31 starts to be raised and lowered at the raising start timing at which target time Ts time is up, component holder 31 is raised to standby height Z0 and the installation operation ends.

In the above-described pressed state, since thrust limit value TL is set within the range of being smaller than biasing force FP before component P lands at the installation position, servo motor 41 presses component P to board 3 with the thrust smaller than biasing force FP. Therefore, compared to the method of the related art of pressing component P against board 3 by the elastic force of biasing member 33 elastically deformed by being pushed in after the landing, the installation load can be stably controlled with high accuracy in the low-load region.

Low-impact installation mode M0-2 illustrated in FIG. 14B is different from high-speed installation mode M0-1 in that deceleration height Dh1 between thrust limit height TLh and landing height ZC is set. In other words, in low-impact installation mode M0-2, when component holder 31 that holds component P reaches deceleration height Dh1 in the process of being lowered from standby height Z0, the lowering speed is switched from high speed to low speed. Accordingly, the effect is obtained that component holder 31 is lowered to landing height ZC and the impact when component P lands is reduced.

In addition, in the process of the above-described installation operation, thrust detector 52 of servo motor controller 50 detects the thrust of servo motor 41. Accordingly, swing detector 61 of servo motor controller 50 can detect that the thrust detected during the period until the raising start timing defined by the operation pattern after the thrust of servo motor 41 is limited has not reached thrust limit value TL. In this manner, the fact that the thrust after the thrust limiting does not reach thrust limit value TL means that there is a possibility that a "swing" state occurs in which component P held by component holder 31 does not land on board 3. In a case where the state occurs, main body controller 14 notifies that the thrust of servo motor 41 has not reached thrust limit value TL by notifier 69.

Next, with reference to FIGS. 15A and 15B, first example M1 of component installation operation by the component placing method will be described. In basic example M0 illustrated in FIGS. 14A and 14B, component holder 31 is raised according to a raising timing determined by the predetermined operation pattern. On the other hand, in the first example M1, the elapsed time after component P held by component holder 31 has landed is measured, and the raising timing of component holder 31 is determined.

The technical significance of applying such a first embodiment M1 will be described. In other words, in a case where the height of the installation position varies due to deformation of the board, the landing height at which component P comes into contact with the solder portion of the board also varies. In such a case, the timing at which component P lands in the installation operation is also not constant. Therefore, it is not possible to appropriately ensure the time for pressing component P against the solder portion, and it is difficult to ensure an appropriate solder bonding quality. In particular, in a case where the pressing time is extremely long, there is a concern that troubles, such as bridges to which solder is connected between adjacent lands or solder balls in a state where particulate solder is separated. Even in a case where the height of the installation position varies in this manner, by applying first embodiment M1 illustrated in the embodiment, it is possible to appropriately ensure the time for pressing component P against the solder portion.

Figure 15A:
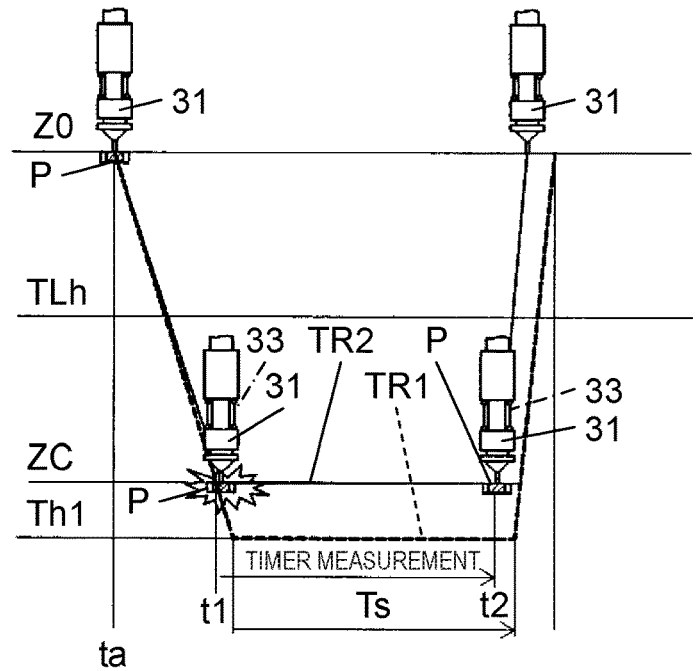
FIG. 15A is an explanatory view of a first example of the installation operation of the component by the component placing device according to the embodiment of the disclosure.

FIG. 15A illustrates high-speed installation mode M1-1 in which component holder 31 is lowered only at high speed in order to shorten the work operation time in first example M1. In addition, FIG. 15B illustrates low-impact installation mode M1-2 in which the impact when component P held by component holder 31 lands is suppressed as much as possible in first example M1.

With reference to FIG. 15A, high-speed installation mode M1-1 will be described. Component holder 31 that holds component P moves above the installation position of board 3 and is in the standby state being positioned at standby height Z0 at timing ta. Next, by controlling servo motor 41 based on the preset operation pattern, component holder 31 is lowered toward the installation position of board 3 with target height Th1 as the target.

Prior to the lowering, thrust limit value TL for limiting the thrust of servo motor 41 is set similarly to basic example M0 illustrated in FIGS. 14A and 14B. In addition, in the middle of the lowering of component holder 31, the thrust of servo motor 41 is limited to be equal to or lower than thrust limit value TL before component P lands at the installation position similar to basic example M0 illustrated in FIGS. 14A and 14B. By the thrust limiting, the same effect as the effect described in basic example M0 illustrated in FIGS. 14A and 14B is obtained.

After this, when component holder 31 is further lowered, component holder 31 reaches landing height ZC. Accordingly, the terminal of held component P comes into contact with the solder portion supplied to board 3, and component P lands on board 3. The landing is detected by the function of landing detector 54 provided in servo motor controller 50 by any of the following methods.

First, one method is performed by monitoring the thrust of servo motor 41 by thrust detector 52 in servo motor controller 50. In other words, the thrust of servo motor 41 of which the thrust is limited to be equal to or lower than thrust limit value TL has reached set thrust limit value TL, it is detected that component P has landed on board 3. Another method of landing detection is a method based on the position signal from servo motor 41. In other words, in a case where the encoder pulse output from encoder 44 of servo motor 41, it is detected that the component has landed on board 3.

When the landing of component P is detected by any of the above-described methods in this manner, the elapsed time after timing t1 at which the landing is detected by the timing function of timer 55 is measured. In addition, when the elapsed time measured by timer 55 reaches target time Ts before the raising start timing defined by the operation pattern indicated by setting trajectory TR1, servo motor 41 is controlled at timing t2 to raise component holder 31.

Accordingly, even in a case where board 3 of which landing height ZC varies due to deformation or the like is targeted, it is always possible to press component P to the solder portion at appropriate target time Ts, and to prevent a solder joint failure caused by variation of the elapsed time. Furthermore, it is possible to prevent the delay of the installation operation time due to unnecessarily long pressing time, and to improve the productivity.

Figure 15B:
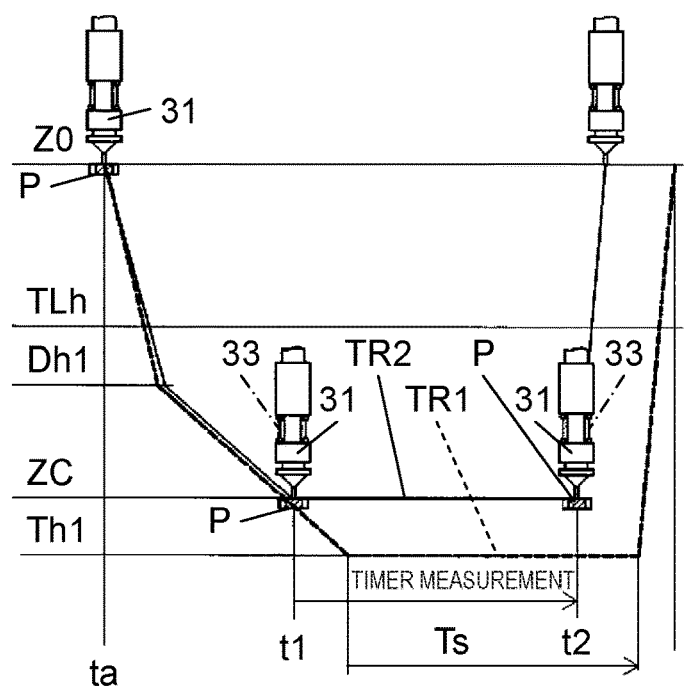
FIG. 15B is an explanatory view of the first example of the installation operation of the component by the component placing device according to the embodiment of the disclosure.

Low-impact installation mode M1-2 illustrated in FIG. 15B is different from high-speed installation mode M1-1 in that deceleration height Dh1 between thrust limit height TLh and landing height ZC is set. In other words, in low-impact installation mode M1-2, when component holder 31 that holds component P reaches deceleration height Dh1 in the process of being lowered from standby height Z0, the lowering speed is switched from high speed to low speed. Accordingly, the effect is obtained that component holder 31 is lowered to landing height ZC and the impact when component P lands is reduced.

Next, with reference to FIGS. 16A and 16B, second example M2 of component installation operation by the component placing method will be described. In second example M2, installation position height measurer 62 measures the installation height at the installation position during the installation operation of placing component P by allowing component P held by component holder 31 to land. In this manner, by measuring the installation height at the installation position during the installation operation, the board height information can be acquired by a simple method without separately performing the measuring operation for board height measurement.

Figure 16A:
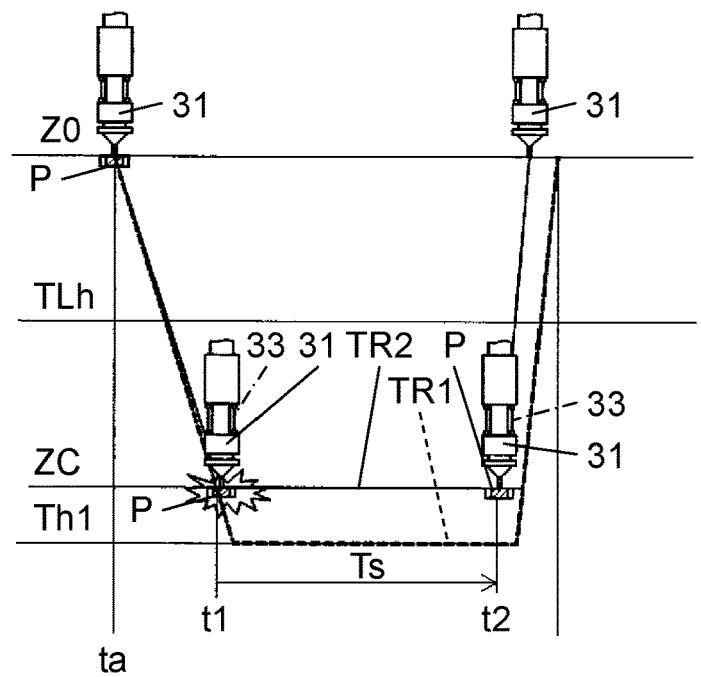
FIG. 16A is an explanatory view of a second example of the installation operation of the component by the component placing device according to the embodiment of the disclosure.

FIG. 16A illustrates high-speed installation mode M2-1 in which component holder 31 is lowered only at high speed in order to shorten the work operation time in second example M2. In addition, FIG. 16B illustrates low-impact installation mode M2-2 in which the impact when component P held by component holder 31 lands is suppressed as much as possible in second example M2.

With reference to FIG. 16A, high-speed installation mode M2-1 will be described. Component holder 31 that holds component P moves above the installation position of board 3 and is in the standby state being positioned at standby height Z0 at timing ta. Next, by controlling servo motor 41 based on the preset operation pattern, component holder 31 is lowered toward the installation position of board 3 with target height Th1 as the target.

Prior to the lowering, thrust limit value TL for limiting the thrust of servo motor 41 is set similarly to basic example M0 illustrated in FIGS. 14A and 14B. In addition, in the middle of the lowering of component holder 31, the thrust of servo motor 41 is limited to be equal to or lower than thrust limit value TL before component P lands at the installation position similar to basic example M0 illustrated in FIGS. 14A and 14B. By the thrust limiting, the same effect as the effect described in basic example M0 illustrated in FIGS. 14A and 14B is obtained.

After this, when component holder 31 is further lowered, component holder 31 reaches landing height ZC. Accordingly, the terminal of held component P comes into contact with the solder portion supplied to board 3, and component P lands on board 3. The landing is detected by the function of landing detector 54 provided in servo motor controller 50 and measures the elapsed time from timing t1 when the landing is detected by the timing function of timer 55. In addition, when the elapsed time measured by timer 55 reaches target time Ts before the raising start timing defined by the operation pattern indicated by setting trajectory TR1, servo motor 41 is controlled at timing t2 to raise component holder 31.

In other words, in the above-described installation operation, after component P has landed at the installation position of board 3, component holder 31 is raised, and component holder 31 is separated from component P that has landed at the installation position of board 3. In addition, at least during the period from the landing of component P to the installation position of board 3 until before component holder 31 starts to be raised, the thrust of servo motor 41 is limited. The pressing by component holder 31 for installing component P is performed in a state where the thrust of servo motor 41 is limited.

In second example M2 illustrated in the embodiment, the installation height is detected during the above-described installation operation. In other words, at a predetermined timing from the time when component P has landed at the installation position of board 3 to immediately before component holder 31 starts to be raised, installation position height measurer 62 acquires the positional information of component holder 31 from position detector 53. The positional information of component holder 31 acquired at the timing is the landing height ZC that indicates the position in the height direction of component holder 31 in FIG. 13. In addition, installation position height measurer 62 calculates the installation height of the installation position at which component P is installed, based on the acquired positional information and the dimension of the installed component P. In other words, installation position height measurer 62 obtains installation height Z1 based on landing height ZC and installation thickness dimension d including the thickness of component P in component P.

In addition, the timing at which installation position height measurer 62 acquires the positional information of component holder 31 from position detector 53 is within the period after biasing member 33 which is the elastic body absorbs the impact when component P lands at the installation position, until immediately before component holder 31 starts to be raised, and is most preferably immediately before the start of the raising. Since acquisition of the positional information is performed in a state where buffering biasing member 33 fully extends, even in a case where buffering biasing member 33 is provided, it is possible to perform the height detection of component holder 31 from the positional information of position detector 53 with high accuracy.

Furthermore, since load LF at which component holder 31 presses board 3 is a low load, the deformation of board 3 is small. Therefore, even when the height of the installation position is measured using the height position of component holder 31, the error is small and accurate height measurement can be performed. Accordingly, it is possible to acquire board height information including the height of the installation position by a simple method concurrently with execution of the component installation operation without using a dedicated measurement device.

Figure 16B:
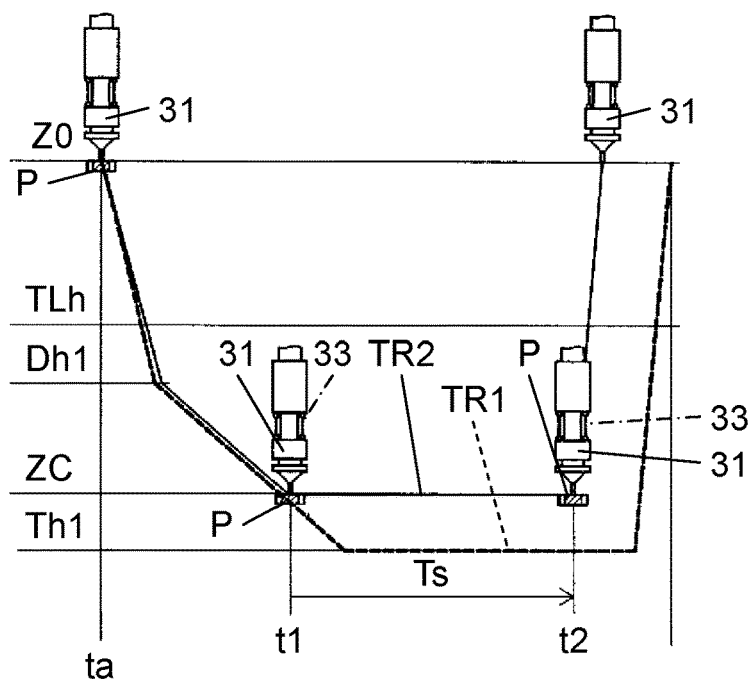
FIG. 16B is an explanatory view of the second example of the installation operation of the component by the component placing device according to the embodiment of the disclosure.

Low-impact installation mode M2-2 illustrated in FIG. 16B is different from high-speed installation mode M2-1 in that deceleration height Dh1 between thrust limit height TLh and landing height ZC is set. In other words, in low-impact installation mode M2-2, when component holder 31 that holds component P reaches deceleration height Dh1 in the process of being lowered from standby height Z0, the lowering speed is switched from high speed to low speed. Accordingly, the effect is obtained that component holder 31 is lowered to landing height ZC and the impact when component P lands is reduced.

Next, with reference to FIGS. 17A and 17B, third example M3 of component installation operation by the component placing method will be described. In third example M3, during the installation operation of placing component P by allowing component P held by component holder 31 to land, the installation height at the installation completion position at which the component is installed is detected, and based on the detected installation height, the deceleration height when installing the component to the uninstallation position is calculated and corrected.

Figures 17A, 17B:
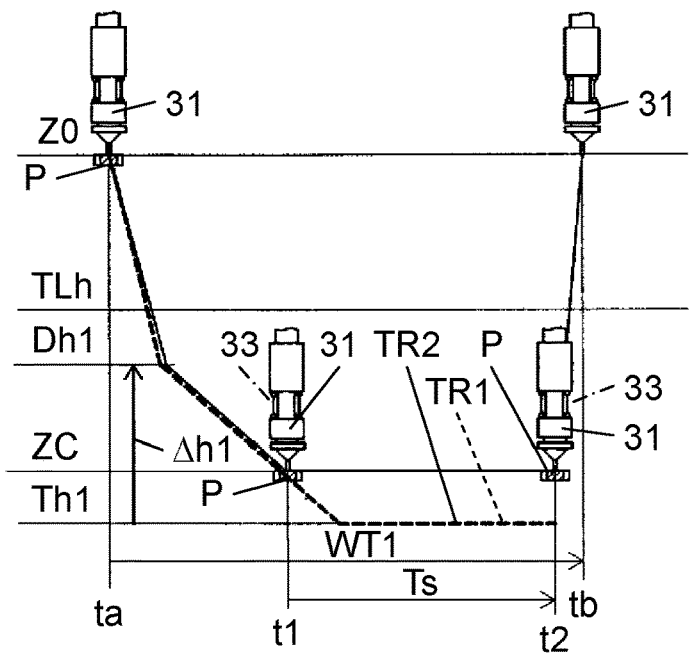
FIG. 17A is an explanatory view of a third example of the installation operation of the component by the component placing device according to the embodiment of the disclosure.
FIG. 17B is an explanatory view of the third example of the installation operation of the component by the component placing device according to the embodiment of the disclosure.

FIG. 17A illustrates pre-correction installation mode M3-1 in which the component installation operation is performed in a state where the installation completion position has not yet existed and the deceleration height is not corrected in third example M3. In addition, 17B illustrates post-correction installation mode M3-2 in which the installation height at the installation completion position is detected in third example M3, the deceleration height is corrected based on the detected installation height, and then the component is installed.

With reference to FIG. 17A, pre-correction installation mode M3-1 will be described. Component holder 31 that holds component P moves above the installation position of board 3 and is in the standby state being positioned at standby height Z0 at timing ta. Next, by controlling servo motor 41 based on the preset operation pattern, component holder 31 is lowered toward the installation position of board 3 with target height Th1 as the target. Here, the operation pattern includes deceleration height Dh1 for decelerating the speed of lowering component holder 31 and target height Th1 which is a target of component holder 31. When lowering component holder 31, component holder 31 is lowered at high speed up to deceleration height Dh1 and at low speed from deceleration height Dh1. In pre-correction installation mode M3-1, deceleration height Dh1 is set to be a height of Δh1 from target height Th1.

Prior to the lowering, thrust limit value TL for limiting the thrust of servo motor 41 is set similarly to basic example M0 illustrated in FIGS. 14A and 14B. In addition, in the middle of the lowering of component holder 31, the thrust of servo motor 41 is limited to be equal to or lower than thrust limit value TL before component P lands at the installation position similar to basic example M0 illustrated in FIGS. 14A and 14B. By the thrust limiting, the same effect as the effect described in basic example M0 illustrated in FIGS. 14A and 14B is obtained.

After this, when component holder 31 is further lowered, component holder 31 reaches landing height ZC. Accordingly, the terminal of held component P comes into contact with the solder portion supplied to board 3, and component P lands on board 3. The landing is detected by the function of landing detector 54 provided in servo motor controller 50 and measures the elapsed time from timing t1 when the landing is detected by the timing function of timer 55. In addition, when the elapsed time measured by timer 55 reaches target time Ts before the raising start timing defined by the operation pattern indicated by setting trajectory TR1, servo motor 41 is controlled at timing t2 to raise component holder 31 and separate component holder 31 from component P that has landed at the installation position. In addition, one installation operation is completed at timing tb when component holder 31 is raised to standby height Z0. In pre-correction installation mode M3-1, work time WT1 is required from timing ta to timing tb for one installation operation.

In order to improve the productivity by shortening work time WT1 as much as possible, in third example M3 illustrated in the embodiment, during the above-described installation operation, detection of the installation height for the purpose of correcting the deceleration height is performed. In other words, at a predetermined timing from the time when component P has landed at the installation position of board 3 to immediately before component holder 31 starts to be raised, installation position height measurer 62 acquires the positional information (landing height ZC) of component holder 31 from position detector 53.

In addition, based on acquired landing height ZC and the dimension of installed component P, installation height measuring processing is performed to calculate the installation height indicating the height at the installation completion position which is the installation position at which component P is installed. The installation height measurement processing is executed by installation position height measurer 62 of main body controller 14. In other words, in FIG. 13, installation height Z1 is obtained based on landing height ZC indicating the position of component holder 31 in the height direction and installation thickness dimension d including the thickness of component P in component P.

Then, similar installation height measurement processing is performed for the plurality of installation completion positions, and the plurality of installation heights are stored in installation height storage 66 of main body controller 14. Next, using at least one installation height stored in installation height storage 66 to calculate the deceleration height when the component is installed at an uninstallation position which is an installation position where the component has not yet been installed. The calculation processing is executed by deceleration height computer 63 of the main body controller 14.

The deceleration height calculation processing is illustrated in the execution example of the deceleration height correction by deceleration height computer 63 described with reference to FIGS. 18A and 18B. In other words, in the example illustrated in FIG. 18A, deceleration height computer 63 computes the deceleration height based on the installation height of the installation completion position that exists within the range preset from the uninstallation position. In other words, in the example illustrated in FIG. 18B, deceleration height computer 63 computes the deceleration height of the uninstallation position based on the installation height of the preset number of installation completion positions. Accordingly, instead of deceleration height Dh1 before correction, corrected deceleration height Dh2 computed based on the installation height of the installation completion position is obtained.

FIG. 17B illustrates post-correction installation mode M3-2 in which component P is installed at the uninstallation position based on corrected deceleration height Dh2 computed in this manner. In the example illustrated here, deceleration height Dh2 after the correction is set to the height of Δh2 from target height Th1. Here, Δh2 is set based on the installation height of the known installation completion position, and thus, Δh2 can be set to an appropriate value smaller than Δh1.

Therefore, it is possible to set the corrected deceleration height Dh2 to a height closer to landing height ZC, and to prevent a delay at the lowering time due to deceleration from an unnecessarily high position. Accordingly, in pre-correction installation mode M3-1, work time WT1 is required from timing ta to timing tb for one installation operation, and meanwhile, in post-correction installation mode M3-2, the required time from timing ta to timing tb is shortened to work time WT2 shorter than WT1. Even in a case where the board on which the curvature deformation state varies in this manner is a target, the productivity can be improved by appropriately setting the deceleration height based on the installation height of the installation completion position.

In addition, in the embodiment, the installation thickness dimension d used in the calculation of installation height Z1 by installation position height measurer 62 and the calculation of the deceleration height Dh2 by deceleration height computer 63 is a thickness dimension obtained by adding the thickness of component P and the thickness of land 3c, but both the thickness of land 3c and the thickness of joining solder S or any of the thickness of land 3c and the thickness of joining solder S may be used as installation thickness dimension d. In a case of ignoring both the thickness of land 3c and the thickness of joining solder S, the thickness of component P may be used as the installation thickness dimension d. In other words, the installation thickness dimension d includes at least the thickness of component P.

The component placing device and the component placing method of the disclosure have the effect that the installation load can be stably controlled with high precision in the low-load region and are useful in the field where the component is placed at the installation position of the board.

What is claimed is:

1. A component placing device which places a component on a board, comprising:
    a shaft;
    a component holder that is attached to the shaft in a state of being displaceable in an up-down direction and holds the component;
    an elastic body that biases the component holder downward with respect to the shaft;
    a motor that raises and lowers the shaft; and
    a processor that controls the motor and causes the component holder to perform a raising and lowering operation for placing the component held by the component holder on the board, wherein
    the processor sets a thrust limit value for limiting a thrust of the motor and limits the thrust of the motor to be equal to or lower than the thrust limit value when the component holder is lowered, and
    the thrust limit value is set within a range in which a load is smaller than a force by which the elastic body biases the component holder, the load acting on the component from the component holder when the motor is driven with the thrust equal to the thrust limit value.

2. The device of claim 1, wherein
the processor
    detects that the component has landed on the board, and
    measures an elapsed time since the landing was detected.

3. The device of claim 2, wherein
the processor controls the motor to raise the component holder when the elapsed time reaches a target time before a raising start timing of the component holder.

4. The device of claim 2, wherein
the processor detects that the component has landed on the board by a position signal from the motor.

5. The device of claim 1, wherein
the processor
    detects the thrust of the motor, and
    detects that the component has landed on the board when it is detected that the thrust of the motor has reached the thrust limit value during thrust limitation of the motor.

6. The device of claim 1, wherein
the processor
    detects the thrust of the motor, and
    detects that the thrust detected during a period from thrust limitation of the motor to a raising start timing of the component holder has not reached the thrust limit value after thrust limitation of the motor.

7. The device of claim 6, wherein
the processor activates a notifier in a case where it is detected that the thrust has not reached the thrust limit value.

8. The device of claim 1, wherein
the motor is a servo motor.

9. The device of claim 8, wherein
the processor performs the raising and lowering operation of the component holder by controlling the servo motor based on a preset operation pattern.

* * * * *